United States Patent
Sakamoto et al.

(10) Patent No.: US 12,238,861 B2
(45) Date of Patent: Feb. 25, 2025

(54) COMPOSITE PRINTED WIRING BOARD AND METHOD OF MANUFACTURING COMPOSITE PRINTED WIRING BOARD

(71) Applicant: Mitsubishi Electric Corporation, Tokyo (JP)

(72) Inventors: Tatsuya Sakamoto, Tokyo (JP); Kenjiro Takanishi, Tokyo (JP); Hitoshi Arai, Tokyo (JP); Hiroshi Goto, Tokyo (JP); Akihito Hirai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/688,376

(22) PCT Filed: Sep. 14, 2022

(86) PCT No.: PCT/JP2022/034410
§ 371 (c)(1),
(2) Date: Mar. 1, 2024

(87) PCT Pub. No.: WO2023/042854
PCT Pub. Date: Mar. 23, 2023

(65) Prior Publication Data
US 2024/0334597 A1    Oct. 3, 2024

(30) Foreign Application Priority Data
Sep. 17, 2021    (JP) .................... 2021-152147

(51) Int. Cl.
*H05K 1/02*    (2006.01)
*H05K 1/03*    (2006.01)
(Continued)

(52) U.S. Cl.
CPC ......... *H05K 1/0298* (2013.01); *H05K 1/0393* (2013.01); *H05K 1/11* (2013.01);
(Continued)

(58) Field of Classification Search
CPC .... H05K 1/0298; H05K 1/0393; H05K 3/429; H05K 3/4602; H05K 1/0272;
(Continued)

(56) References Cited

U.S. PATENT DOCUMENTS 5,780,776 A * 7/1998 Noda ..................... H05K 1/186
361/764
6,232,652 B1 * 5/2001 Matsushima ......... H01L 23/055
257/667

(Continued)

FOREIGN PATENT DOCUMENTS

JP    H06-326439 A    11/1994
JP    H11-068333 A    3/1999
(Continued)

OTHER PUBLICATIONS

International Search Report and Written Opinion mailed on Nov. 15, 2022, received for PCT Application PCT/JP2022/034410, filed on Sep. 14, 2022, 11 pages including English Translation.
(Continued)

*Primary Examiner* — Ishwarbhai B Patel
(74) *Attorney, Agent, or Firm* — XSENSUS LLP

(57) ABSTRACT

A composite printed wiring board includes a first printed wiring board, a second printed wiring board, an intermediate plate, a first bonding layer, and a second bonding layer. The intermediate plate is provided to surround a space. The first printed wiring board closes one side of the space and is bonded to the intermediate plate. The second printed wiring board closes the other side of the space and is bonded to the intermediate plate. At least any of the first printed wiring board and the second printed wiring board has a through hole. A cavity is provided that is the space surrounded by the first printed wiring board, the second printed wiring board, the intermediate plate, the first bonding layer, and the second
(Continued)

bonding layer. The through hole in communication with the cavity.

13 Claims, 38 Drawing Sheets

(51) Int. Cl.
*H05K 1/11* (2006.01)
*H05K 1/14* (2006.01)
*H05K 1/18* (2006.01)
*H05K 3/42* (2006.01)
*H05K 3/46* (2006.01)

(52) U.S. Cl.
CPC ............ *H05K 1/144* (2013.01); *H05K 1/181* (2013.01); *H05K 3/429* (2013.01); *H05K 3/4602* (2013.01); *H05K 3/4697* (2013.01)

(58) Field of Classification Search
CPC . H05K 1/144; H05K 1/02; H05K 1/11; H05K 1/14; H05K 3/4697
See application file for complete search history.

(56) References Cited

U.S. PATENT DOCUMENTS

| | | | | |
|---|---|---|---|---|
| 10,299,372 | B2* | 5/2019 | Dragone | ............... H05K 1/0272 |
| 2004/0231884 | A1* | 11/2004 | Wong | ..................... H05K 3/341 |
| | | | | 174/259 |
| 2022/0209402 | A1 | 6/2022 | Yokokawa et al. | |

FOREIGN PATENT DOCUMENTS

| | | |
|---|---|---|
| JP | 2007-250608 A | 9/2007 |
| JP | 2007-318047 A | 12/2007 |
| JP | 2008-021873 A | 1/2008 |
| WO | 2020/261332 A1 | 12/2020 |

OTHER PUBLICATIONS

Decision to Grant mailed on Oct. 17, 2023, received for JP Application 2023-541321, 11 pages including English Translation.

* cited by examiner

COMPOSITE PRINTED WIRING BOARD AND METHOD OF MANUFACTURING COMPOSITE PRINTED WIRING BOARD

CROSS-REFERENCE TO RELATED APPLICATION

This application is based on PCT filing PCT/JP2022/034410, filed Sep. 14, 2022, which claims priority from Japanese Patent Application No. 2021-152147, filed Sep. 17, 2021, the entire contents of each are incorporated herein by reference.

TECHNICAL FIELD

The present disclosure relates to a composite printed wiring board and a method of manufacturing a composite printed wiring board.

BACKGROUND ART

Some conventional composite printed wiring boards have a cavity. For example, an antenna device (composite printed wiring board) disclosed in WO 2020/261332 (PTL 1) includes a first dielectric substrate (first printed wiring board), a second dielectric substrate (second printed wiring board), a third dielectric substrate (intermediate plate), a first solder (first bonding layer), and a second solder (second bonding layer). A hollow structure (cavity) is provided in the first dielectric substrate, the second dielectric substrate, the third dielectric substrate, the first solder, and the second solder. The hollow structure is sealed. The first dielectric substrate and the third dielectric substrate are soldered by the first solder. The second dielectric substrate and the third dielectric substrate are soldered by the second solder.

CITATION LIST

Patent Literature

PTL 1: WO 2020/261332

SUMMARY OF INVENTION

Technical Problem

In the antenna device disclosed in the publication above, the antenna device is heated in soldering of the first dielectric substrate to the third dielectric substrate and soldering of the second dielectric substrate to the third dielectric substrate. Thus, the inside of the sealed hollow structure is also heated. The air inside the sealed hollow structure thus expands. As a result, the pressure inside the sealed hollow structure becomes higher than the pressure outside the hollow structure. Consequently, the first dielectric substrate and the second dielectric substrate deform due to a pressure difference between the pressure inside the hollow structure and the pressure outside the hollow structure.

The present disclosure has been made in view of the above problem. An object of the present disclosure is to provide a composite printed wiring board that can suppress deformations of a first printed wiring board and a second printed wiring board and to provide a method of manufacturing the composite printed wiring board.

Solution to Problem

A composite printed wiring board of the present disclosure includes a first printed wiring board, a second printed wiring board, an intermediate plate, a first bonding layer, and a second bonding layer. The intermediate plate is provide to surround a space. The first printed wiring board closes one side of the space and is bonded to the intermediate plate. The second printed wiring board closes the other side of the space and is bonded to the intermediate plate. The first bonding layer bonds the first printed wiring board to the intermediate plate. The second bonding layer bonds the second printed wiring board to the intermediate plate. At least any of the first printed wiring board and the second printed wiring board has a through hole. A cavity is provided that is a space surrounded by the first printed wiring board, the second printed wiring board, the intermediate plate, the first bonding layer, and the second bonding layer. The through hole communicates with the cavity.

Advantageous Effects of Invention

In the composite printed wiring board according to the present disclosure, the through hole communicates with the cavity. This allows the pressure inside the cavity to be equal to the pressure outside the cavity. Therefore, deformations of the first printed wiring board and the second printed wiring board can be suppressed.

DESCRIPTION OF EMBODIMENTS

Figure 1:
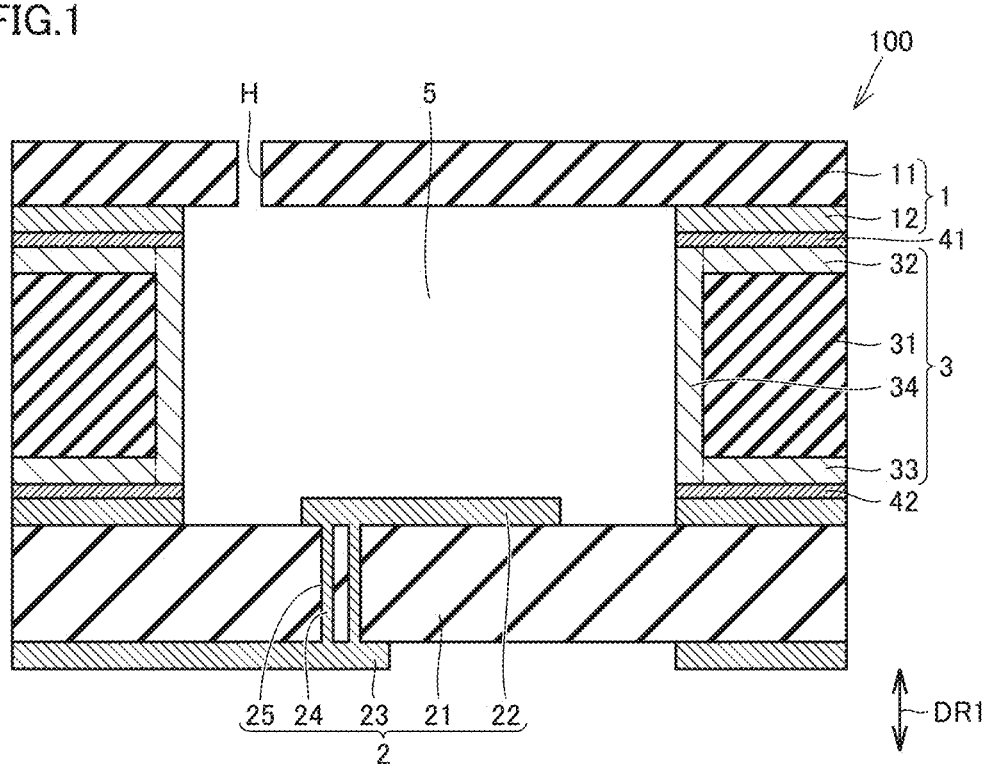
FIG. 1 is a sectional view schematically showing a configuration of a composite printed wiring board according to Embodiment 1.

Embodiments will now be described with reference to the drawings. The same or corresponding parts will be designated by the same reference characters, and redundant description will not be repeated.

Embodiment 1

A configuration of a composite printed wiring board 100 according to Embodiment 1 will be described with reference to FIG. 1.

As shown in FIG. 1, composite printed wiring board 100 mainly includes a first printed wiring board 1, a second printed wiring board 2, an intermediate plate 3, a first bonding layer 41, and a second bonding layer 42. Composite printed wiring board 100 may further include an electronic part 7 (see FIG. 10), as will be described later. Composite printed wiring board 100 is configured as a composite substrate.

First printed wiring board 1 is a printed circuit board. First printed wiring board 1 includes a first insulation layer 11 and a first wiring layer 12. First insulation layer 11 and first wiring layer 12 are stacked. First printed wiring board 1 may be a multilayer substrate.

First wiring layer 12 is made of, for example, copper (Cu). Although not shown in the figure, a surface of first wiring layer 12 may be covered with a first plated layer. This suppresses corrosion of first wiring layer 12. The first plated layer is, for example, a nickel (Ni)-gold (Au) flash plating.

Second printed wiring board 2 faces first printed wiring board 1. Second printed wiring board 2 faces first printed wiring board 1 while being spaced from first printed wiring board 1. In the present embodiment, the direction in which first printed wiring board 1 faces second printed wiring board 2 is a first direction DR1.

Second printed wiring board 2 is a printed circuit board. In the present embodiment, second printed wiring board 2 includes a second insulation layer 21, a second wiring layer 22, a second surface wiring layer 23, and a connecting portion 24. Second wiring layer 22, second insulation layer 21, and second surface wiring layer 23 are stacked in order. Second wiring layer 22 faces first printed wiring board 1. Second surface wiring layer 23 is disposed on the side opposite to second wiring layer 22 with respect to second insulation layer 21. Second insulation layer 21 has a through hole 25 passing through second insulation layer 21. Connecting portion 24 is disposed in through hole 25. Connecting portion 24 connects second wiring layer 22 to second surface wiring layer 23. Second printed wiring board 2 may be a multilayer substrate. In the present embodiment, second printed wiring board 2 has no through hole H.

Second wiring layer 22 is made of, for example, copper (Cu). Although not shown in the figure, a surface of second wiring layer 22 may be covered with a second plated layer. This suppresses corrosion of second wiring layer 22. The second plated layer is, for example, a nickel (Ni)-gold (Au) flash plating.

Intermediate plate 3 is sandwiched between first printed wiring board 1 and second printed wiring board 2. Intermediate plate 3 is sandwiched between first printed wiring board 1 and second printed wiring board 2 along first direction DR1.

Intermediate plate 3 is a substrate. Intermediate plate 3 may be a multilayer substrate. Intermediate plate 3 may be made of a metal such as copper (Cu). Herein, intermediate plate 3 includes an intermediate insulation layer 31, a first intermediate wiring layer 32, a second intermediate wiring layer 33, and a lateral wiring layer 34. In FIG. 1, the boundary between first intermediate wiring layer 32, second intermediate wiring layer 33 and lateral wiring layer 34 is indicated by the single-dot chain line. First intermediate wiring layer 32, second intermediate wiring layer 33, and lateral wiring layer 34 cover intermediate insulation layer 31. First intermediate wiring layer 32 is bonded to first wiring layer 12 by first bonding layer 41. Second intermediate wiring layer 33 is bonded to second wiring layer 22 by second bonding layer 42. First intermediate wiring layer 32 and second intermediate wiring layer 33 extend in an in-plane direction of first printed wiring board 1. Lateral wiring layer 34 connects first intermediate wiring layer 32 to second intermediate wiring layer 33. Lateral wiring layer 34 extends along first direction DR1.

Intermediate plate 3 has such an annular shape as to surround a cavity 5, which will be described later. Intermediate plate 3 is processed into an annular shape by, for example, machining. After processing of intermediate plate 3 into an annular shape, for example, first intermediate wiring layer 32, second intermediate wiring layer 33, and lateral wiring layer 34 may be formed in intermediate plate 3 by copper (Cu) plating of a through hole. Then, tin (Sn) plating is performed as surface treatment, where tin (Sn) is a metal having a lower melting point than the melting point of first wiring layer 12 and second wiring layer 22.

First bonding layer 41 bonds first printed wiring board 1 to intermediate plate 3. First bonding layer 41 is sandwiched between first printed wiring board 1 and intermediate plate 3 along first direction DR1. Second bonding layer 42 bonds second printed wiring board 2 to intermediate plate 3. Second bonding layer 42 is sandwiched between second printed wiring board 2 and intermediate plate 3 along first direction DR1.

In the present embodiment, first bonding layer 41 and second bonding layer 42 are formed of a metallic compound. First bonding layer 41 and second bonding layer 42 formed of the metallic compound have a melting point of, for example, 415° C. or higher and 795° C. or lower. First bonding layer 41 and second bonding layer 42 formed of the metallic compound have a higher melting point than the melting point of first bonding layer 41 and second bonding layer 42 formed of a conductive adhesive sheet, which will be described later.

Each of first bonding layer 41 and second bonding layer 42 includes a first metal and a second metal. The first metal has a higher melting point than the melting point of the second metal. Examples of the first metal include copper (Cu), nickel (Ni), iron (Fe), chromium (Cr), silver (Ag), and an alloy thereof. Examples of the second metal include tin (Sn), bismuth (Bi), indium (In), and an alloy thereof. Each of first bonding layer 41 and second bonding layer 42 is a mutual diffusion layer formed through bonding of the first metal and the second metal by liquid phase diffusion bonding. The first metal and the second metal bonded by liquid phase diffusion bonding form a metallic compound that is the mutual diffusion layer of the first metal and the second metal. For example, when nickel (Ni) plated to first wiring layer 12 or second wiring layer 22 diffuses, a metallic compound of $Cu_6Sn_5$, $Cu_3Sn$, $Ni_3Sn_4$, or the like is formed. The melting point of $Cu_6Sn_5$ is, for example, 415° C. The melting point of $Cu_3Sn$ is, for example, 680° C. The melting point of $Ni_3Sn_4$ is, for example, 795° C.

Cavity 5 is provided that is a space surrounded by first printed wiring board 1, second printed wiring board 2, intermediate plate 3, first bonding layer 41, and second bonding layer 42. Cavity 5 is a hollow provided in composite printed wiring board 100. Cavity 5 is formed by, for example, machining. Cavity 5 is surrounded by first printed wiring board 1, second printed wiring board 2, intermediate plate 3, first bonding layer 41, and second bonding layer 42. Cavity 5 is sandwiched between first printed wiring board 1 and second printed wiring board 2 along first direction DR1. Cavity 5 is surrounded by intermediate plate 3, first bonding layer 41, and second bonding layer 42. Intermediate plate 3, first bonding layer 41, and second bonding layer 42 have such an annular shape as to surround cavity 5. In other words, first printed wiring board 1 closes one side of cavity 5 along first direction DR1 and is bonded to intermediate plate 3 by first bonding layer 41. Second printed wiring board 2 closes the other side of cavity 5 along first direction DR1 and is bonded to intermediate plate 3 by second bonding layer 42.

At least any of first printed wiring board 1 and second printed wiring board 2 has through hole H. Through hole H passes through at least any of first printed wiring board 1 and second printed wiring board 2. Through hole H passes through at least any of first printed wiring board 1 and second printed wiring board 2 along first direction DR1. In the present embodiment, through hole H is provided in first printed wiring board 1. In other words, through hole H passes through first printed wiring board 1. Through hole H is not provided in second printed wiring board 2. Through hole H is provided in first insulation layer 11. Through hole H is not covered with a wiring layer (first wiring layer 12 and second wiring layer 22).

Through hole H communicates with cavity 5. Through hole H connects the inside of cavity 5 to the outside of cavity 5. Air can travel between the inside of cavity 5 and the outside of cavity 5 through through hole H.

The shape of through hole H may be determined as appropriate. Although not shown in the figure, through hole H may include a plurality of through portions. In order to suppress intrusion of a foreign matter, such as condensed water and dust, into cavity 5 through through hole H, through hole H desirably has a smaller hole diameter, and the number of through portions is desirably lower.

Cavity 5 and through hole H are configured as a path for gas. When composite printed wiring board 100 is applied to an antenna device, cavity 5 is used as a path for electric signals (radio waves).

Next, a configuration of composite printed wiring board 100 according to a variation of Embodiment 1 will be described with reference to FIG. 2.

Figure 2:
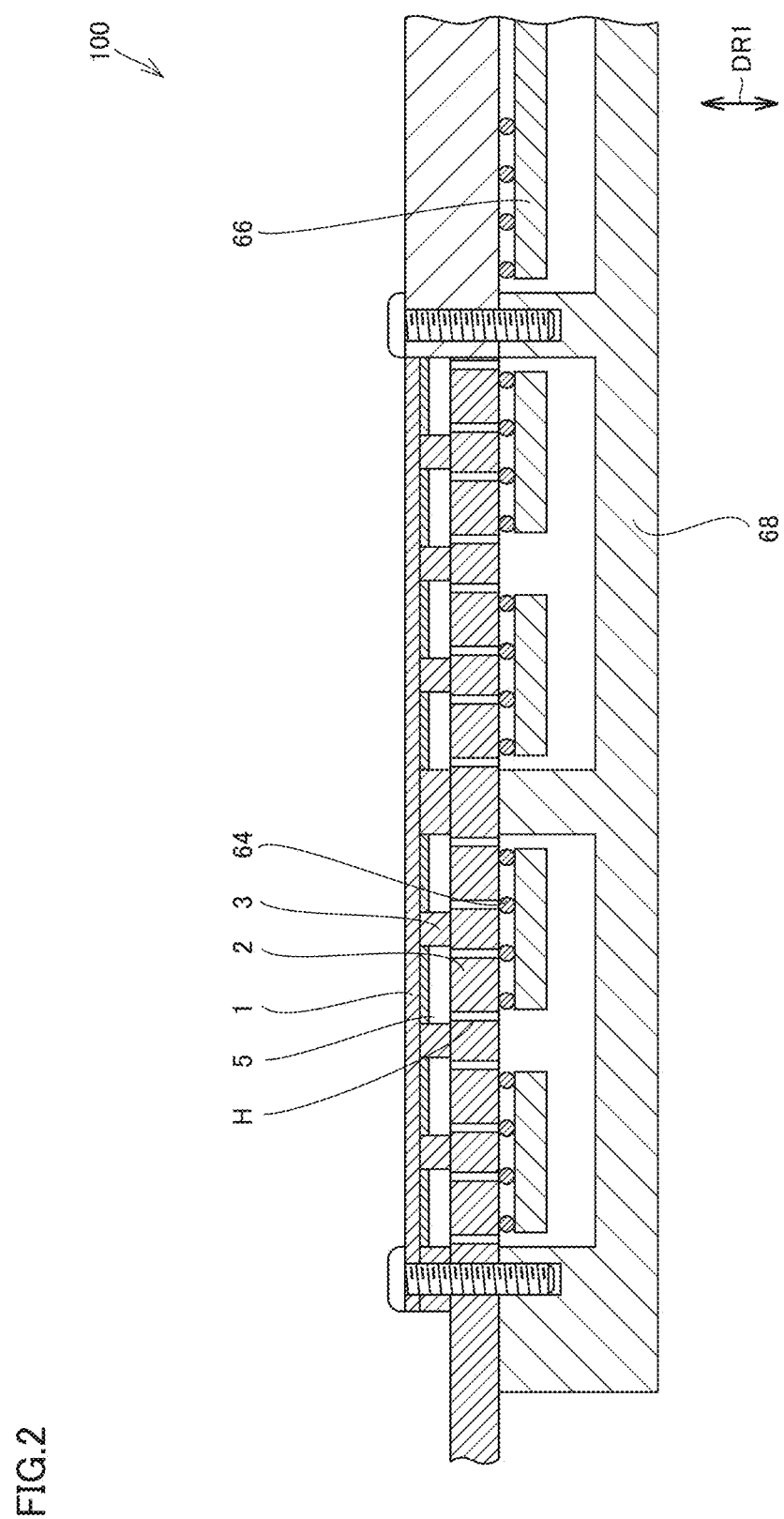
FIG. 2 is a sectional view schematically showing a configuration of a composite printed wiring board according to a variation of Embodiment 1.

As shown in FIG. 2, composite printed wiring board 100 according to the variation of Embodiment 1 may further include a bonding member 64, a part 66, and a base plate 68. Through hole H is provided in second printed wiring board 2. For convenience of description, FIG. 2 does not show first bonding layer 41 (see FIG. 1) and second bonding layer 42 (see FIG. 1).

Part 66 is disposed on the side opposite to first printed wiring board 1 with respect to second printed wiring board 2. Part 66 is bonded to second printed wiring board 2 by bonding member 64. Base plate 68 supports second printed wiring board 2. Base plate 68 is disposed on the side opposite to first printed wiring board 1 with respect to second printed wiring board 2. Base plate 68 is configured to cover through hole H.

Next, a method of manufacturing composite printed wiring board 100 according to Embodiment 1 will be described with reference to FIGS. 3 to 7.

Figure 3:
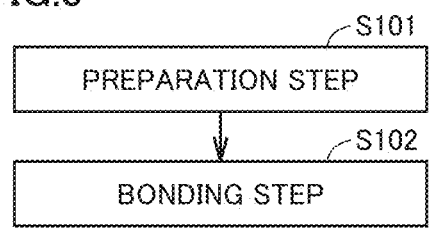
FIG. 3 is a flowchart schematically showing a method of manufacturing a composite printed wiring board according to Embodiment 1.

As shown in FIG. 3, the method of manufacturing composite printed wiring board 100 includes a preparation step S101 and a bonding step S102.

Figure 4:
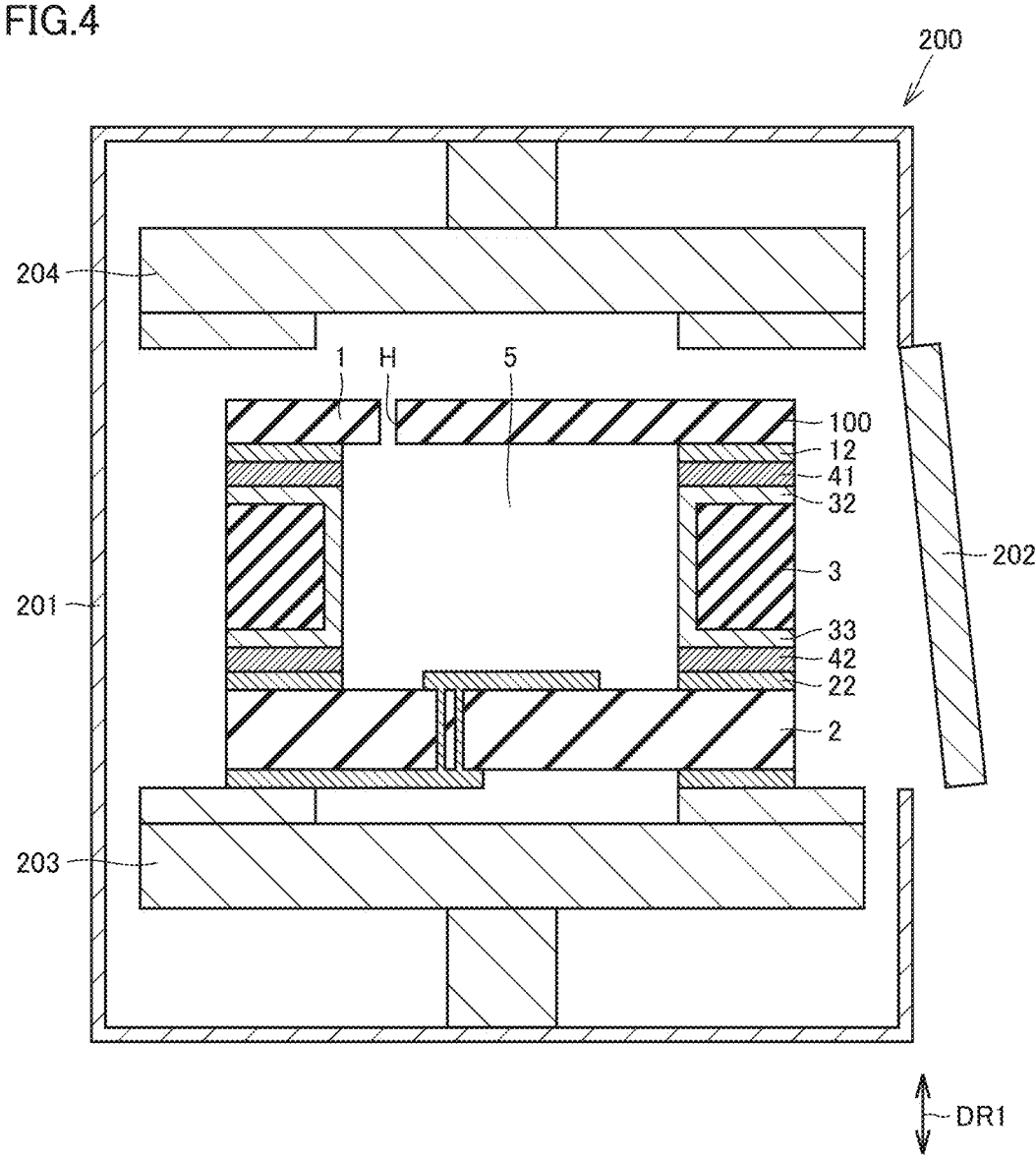
FIG. 4 is a sectional view schematically showing a state in which the composite printed wiring board according to Embodiment 1 is disposed on a stage in a press furnace.

As shown in FIG. 4, in preparation step S101, first printed wiring board 1, second printed wiring board 2, intermediate plate 3, first bonding layer 41, and second bonding layer 42 are prepared. First printed wiring board 1, second printed wiring board 2, intermediate plate 3, first bonding layer 41, and second bonding layer 42 are prepared such that first bonding layer 41 is disposed between first printed wiring board 1 and intermediate plate 3 and second bonding layer 42 is disposed between second printed wiring board 2 and intermediate plate 3. In preparation step S101, each of first bonding layer 41 and second bonding layer 42 is a layer made of the first metal and a layer made of the second metal having a lower melting point than the melting point of the first metal. First printed wiring board 1, second printed wiring board 2, intermediate plate 3, first bonding layer 41, and second bonding layer 42 are prepared such that cavity 5, which is a space surrounded by first printed wiring board 1, second printed wiring board 2, intermediate plate 3, first bonding layer 41, and second bonding layer 42, is provided. First printed wiring board 1, second printed wiring board 2, intermediate plate 3, first bonding layer 41, and second bonding layer 42 are prepared such that through hole H is provided in at least any of first printed wiring board 1 and second printed wiring board 2. Specifically, first printed wiring board 1, second printed wiring board 2, and intermediate plate 3 are laid up (stacked) such that intermediate plate 3 is disposed between first printed wiring board 1 and second printed wiring board 2. In other words, first printed wiring board 1, second printed wiring board 2, and intermediate plate 3 are laid up (stacked) such that one side of cavity 5 along first direction DR1 is closed by first printed wiring board 1 and intermediate plate 3 and the other side of cavity 5 along first direction DR1 is closed by second printed wiring board 2 and intermediate plate 3. A laying-up step is similar to a step of stacking a common multilayer substrate. In the laying-up step, first bonding layer 41 is disposed between first printed wiring board 1 and intermediate plate 3, and second bonding layer 42 is disposed between second printed wiring board 2 and intermediate plate 3. First printed wiring board 1, second printed wiring board 2, intermediate plate 3, first bonding layer 41, and second bonding layer 42 are disposed in a housing 201 of a press furnace 200 at atmospheric pressure. Second printed wiring board 2 is disposed on a stage 203 in housing 201 of press furnace 200.

Figure 5:
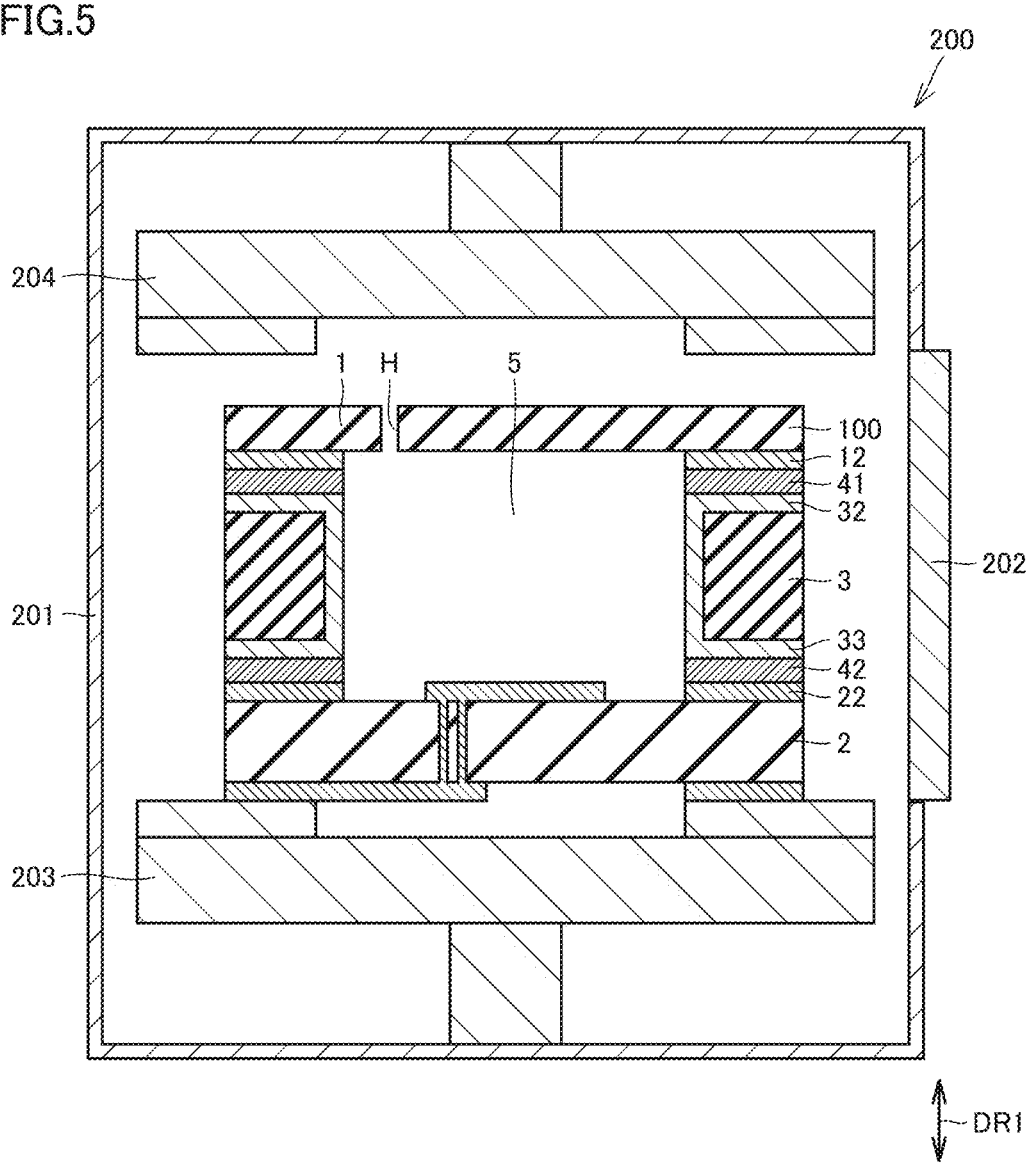
FIG. 5 is a sectional view schematically showing a state in which the composite printed wiring board according to Embodiment 1 is disposed in a sealed press furnace.

Subsequently, as shown in FIG. 5, press furnace 200 with a door 202 closed (in a sealed state) is subjected to evacuation, thus creating a vacuum in housing 201. This creates a vacuum in cavity 5. In preparation step S101, first printed wiring board 1 is not bonded to intermediate plate 3 by first bonding layer 41, and second printed wiring board 2 is not bonded to intermediate plate 3 by second bonding layer 42.

Figure 6:
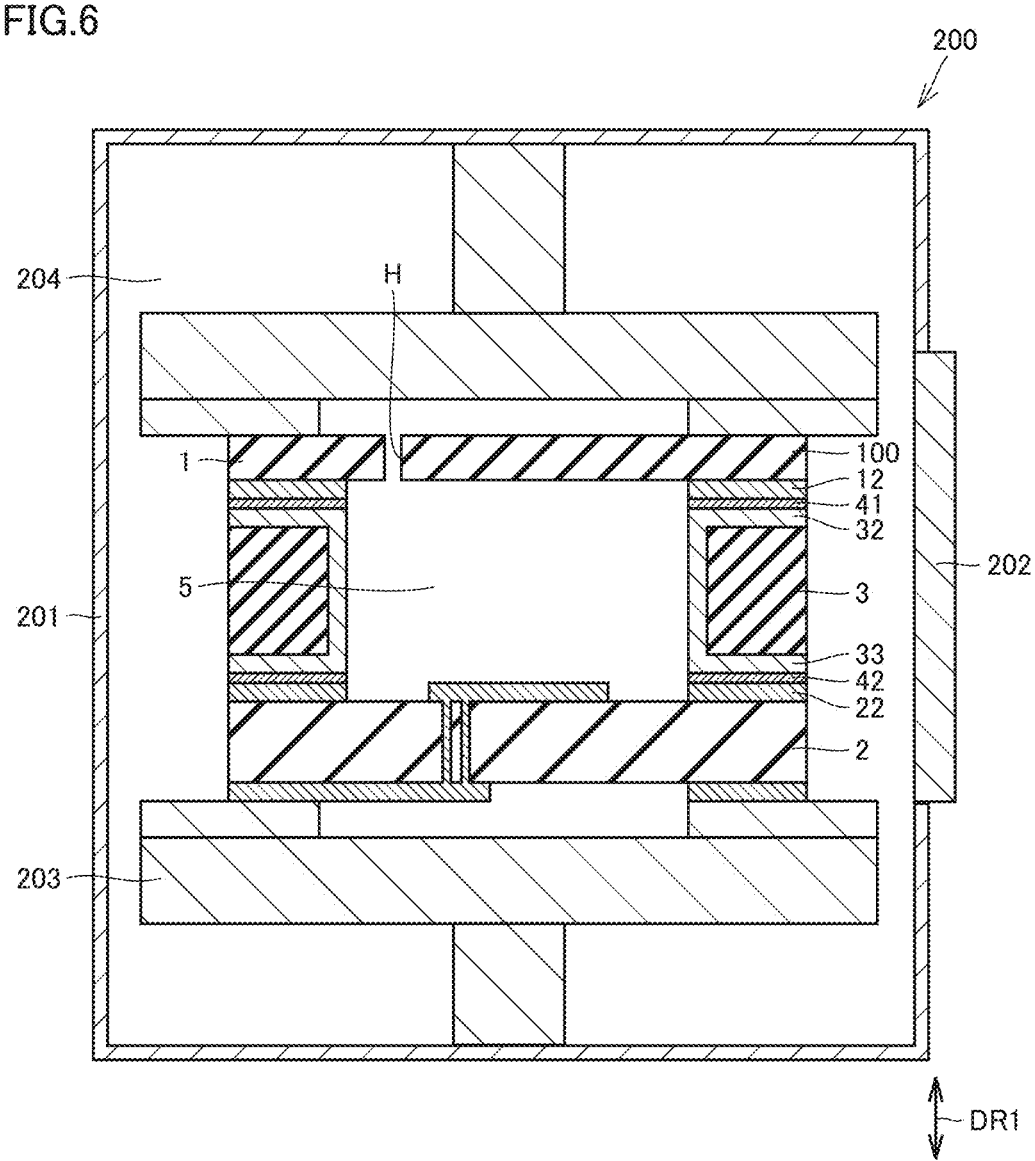
FIG. 6 is a sectional view schematically showing a state in which the composite printed wiring board according to Embodiment 1 is pressurized by a pressing machine in the sealed press furnace.

Subsequently, as shown in FIG. 6, in bonding step S102, intermediate plate 3 is bonded to first printed wiring board 1 and second printed wiring board 2 by first bonding layer 41 and second bonding layer 42, respectively, with cavity 5 communicating with through hole H. In bonding step S102, the second metal is melted by heating to a temperature equal to or higher than the melting point of the second metal, to thereby mutually diffuse the first metal and the second metal, forming first bonding layer 41 and second bonding layer 42. In other words, after bonding step S102, first bonding layer 41 and second bonding layer 42 are formed of a metallic compound that is a mutual diffusion layer of the first metal and the second metal. Thus, first printed wiring board 1 is electrically connected to intermediate plate 3 by first bonding layer 41, and second printed wiring board 2 is electrically connected to intermediate plate 3 by second bonding layer 42. First wiring layer 12 is electrically connected to first intermediate wiring layer 32, and second wiring layer 22 is electrically connected to second intermediate wiring layer 33.

In the present embodiment, a vacuum pressurization and heating press is used in bonding step S102. With the inside of and outside of cavity 5 under vacuum, intermediate plate 3 is bonded to first printed wiring board 1 and second printed wiring board 2 by first bonding layer 41 and second bonding layer 42, respectively. Specifically, composite printed wiring board 100 is heated in press furnace 200 under vacuum. Composite printed wiring board 100 is heated to, for example, 250° C. or higher and 260° C. or lower. Through heating, first printed wiring board 1 is bonded to intermediate plate 3 by first bonding layer 41, and second printed wiring board 2 is bonded to intermediate plate 3 by second bonding layer 42. Also, composite printed wiring board 100 is pressurized by a pressing machine 204 under vacuum. Under vacuum, thus, first printed wiring board 1 is bonded to intermediate plate 3 by first bonding layer 41, and second printed wiring board 2 is bonded to intermediate plate 3 by second bonding layer 42.

Figure 7:
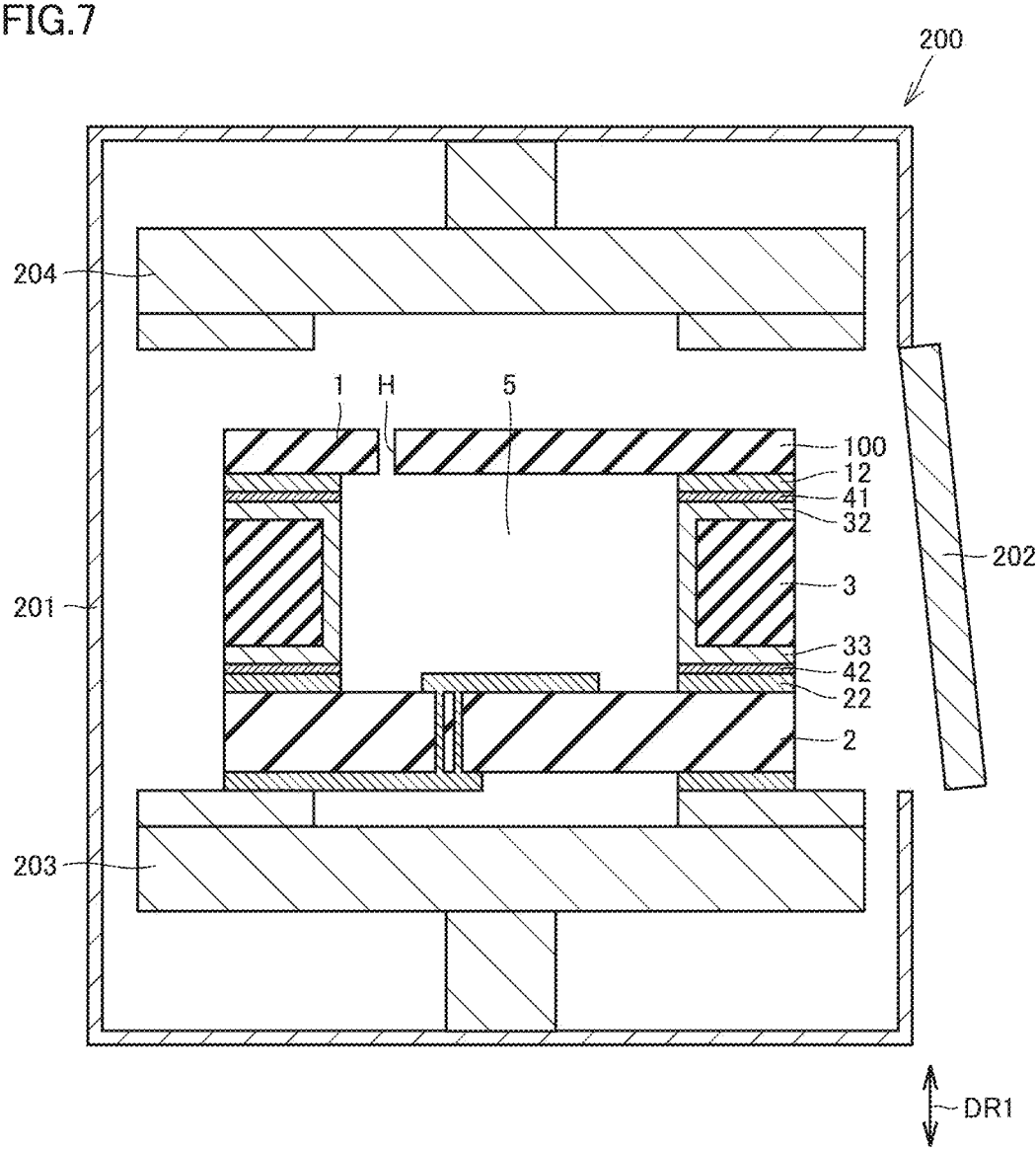
FIG. 7 is a sectional view schematically showing a state in which a first printed wiring board of the composite wiring according to Embodiment 1 is bonded to an intermediate plate by a first bonding layer and a second printed wiring board of the composite wiring is bonded to the intermediate plate by a second bonding layer.

Subsequently, as door 202 of press furnace 200 is opened as shown in FIG. 7, the pressure inside housing 201 of press furnace 200 becomes equal to atmospheric pressure. Also, composite printed wiring board 100 is released from pressurization by pressing machine 204. Thus, the pressure inside cavity 5 becomes equal to atmospheric pressure. Subsequently, a post-process in common substrate manufacture is performed on composite printed wiring board 100. The post-process is, for example, machining. Consequently, composite printed wiring board 100 is complete.

Figure 8:
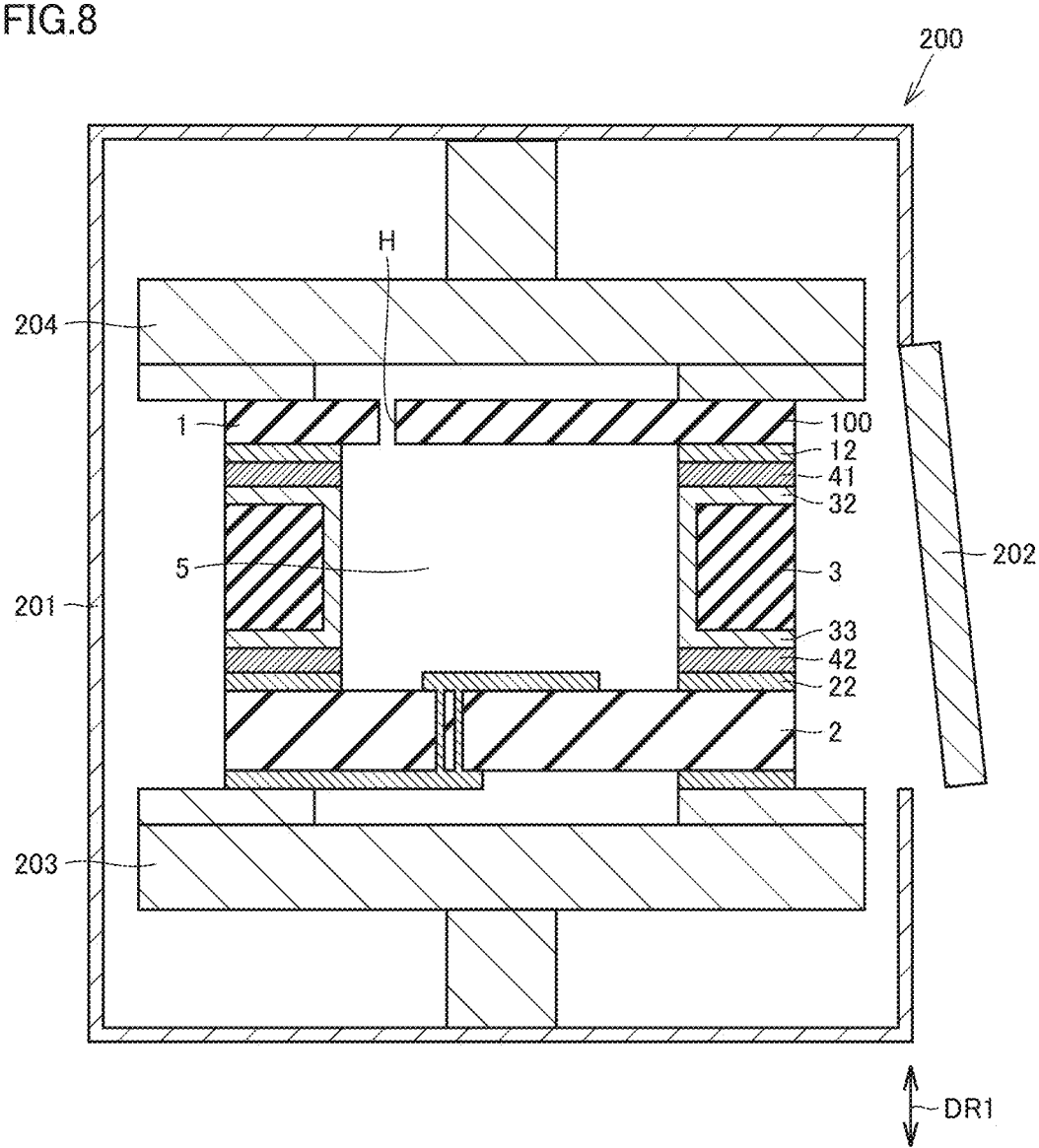
FIG. 8 is a sectional view schematically showing a state in which a composite printed wiring board is pressurized by a pressing machine in a press furnace in a method of manufacturing a composite printed wiring board according to a variation of Embodiment 1.

Next, a method of manufacturing composite printed wiring board 100 according to the variation of Embodiment 1 will be described with reference to FIGS. 8 and 9.

In the present embodiment, an atmospheric-pressure pressurization and heating press is used in bonding step S102. As shown in FIG. 8, press furnace 200 with door 202 opened is used in bonding step S102. At atmospheric pressure, composite printed wiring board 100 is heated in press furnace 200. Also, as shown in FIG. 9, composite printed wiring board 100 is pressurized by pressing machine 204 at atmospheric pressure. With the pressures inside and outside cavity 5 equal to atmospheric pressure, intermediate plate 3 is bonded to first printed wiring board 1 and second printed wiring board 2 by first bonding layer 41 and second bonding layer 42, respectively. In bonding step S102, the pressure inside cavity 5 is maintained at atmospheric pressure.

Next, functions and effects of the present embodiment will be described in comparison with composite printed wiring board 100 according to a comparative example (not shown).

Composite printed wiring board 100 according to the comparative example has no through hole H. In composite printed wiring board 100 according to the comparative example, cavity 5 is sealed by first printed wiring board 1, second printed wiring board 2, intermediate plate 3, first bonding layer 41, and second bonding layer 42. In other words, cavity 5 is hermetically sealed. Composite printed wiring board 100 according to the comparative example has the same configuration as that of composite printed wiring board 100 according to the present embodiment except for that cavity 5 is sealed because of the absence of through hole H.

In the process of manufacturing composite printed wiring board 100 according to the comparative example, composite printed wiring board 100 may be heated at atmospheric pressure. For example, when first bonding layer 41 and second bonding layer 42 are bonded by the atmospheric-pressure pressurization and heating press, composite printed wiring board 100 is heated at atmospheric pressure. For example, when electronic part 7 (see FIG. 10) is soldered to first printed wiring board 1 or second printed wiring board 2 by reflow soldering, composite printed wiring board 100 is heated at atmospheric pressure. When composite printed wiring board 100 is heated at atmospheric pressure, since cavity 5 is sealed, the pressure inside cavity 5 rises as the air heated inside cavity 5 expands. This causes the pressure inside cavity 5 to be higher than the pressure outside cavity 5. Thus, first printed wiring board 1 and second printed wiring board 2 are pressurized toward the outside of cavity 5. Consequently, first printed wiring board 1 and second printed wiring board 2 may deform so as to expand toward the outside of cavity 5. An amount of deformations of first printed wiring board 1 and second printed wiring board 2 is affected by the thickness and rigidity of first printed wiring board 1 and second printed wiring board 2.

In the process of manufacturing composite printed wiring board 100 according to the comparative example, the pressure inside cavity 5 may be made lower than atmospheric pressure. For example, when first bonding layer 41 is bonded to second bonding layer 42 by the vacuum pressurization and heating press, a vacuum is created inside of cavity 5 in housing 201 of sealed press furnace 200. After bonding of first bonding layer 41 and second bonding layer 42 by the vacuum pressurization and heating press, the pressure outside cavity 5 becomes equal to atmospheric pressure as press furnace 200 is opened. This causes the pressure inside cavity 5 to be lower than the pressure outside cavity 5. Thus, first printed wiring board 1 and second printed wiring board 2 are pressurized toward the inside of cavity 5. Consequently, first printed wiring board 1 and second printed wiring board 2 may deform so as to be recessed toward the inside of cavity 5.

In composite printed wiring board 100 according to the comparative example, when the pressure outside cavity 5 (the pressure in the environment) becomes higher than the pressure inside cavity 5, first printed wiring board 1 and second printed wiring board 2 may deform to be recessed toward the inside of cavity 5.

As described above, first printed wiring board 1 and second printed wiring board 2 may deform in composite printed wiring board 100 according to the comparative example.

Contrastingly, in composite printed wiring board 100 according to the present embodiment, through hole H communicates with cavity 5 as shown in FIG. 1. This causes the inside of cavity 5 to be connected to the outside of cavity 5 by through hole H provided in first printed wiring board 1. Thus, the pressure inside cavity 5 can be made equal to the pressure outside cavity 5. This can suppress deformations of first printed wiring board 1 and second printed wiring board 2 due to a pressure difference between the pressure inside cavity 5 and the pressure outside cavity 5. Consequently, the deformations of first printed wiring board 1 and second printed wiring board 2 can be suppressed.

Since the deformations of first printed wiring board 1 and second printed wiring board 2 can be suppressed, printing failures in cream solder printing required for mounting of electronic parts can be suppressed in a part mounting step, which is a post-process. Also, the deformations of first printed wiring board 1 and second printed wiring board 2, which are caused by the pressure due to expansion of the air inside cavity 5 at a reflow soldering temperature in reflow soldering, can be suppressed. Thus, mounting failures occurring in reflow soldering can be suppressed. Also, the deformation of the substrate can be suppressed even when the pressure inside cavity 5 changes due to changes in the environment around composite printed wiring board 100 (the atmospheric pressure and temperature around composite printed wiring board 100). This improves the tolerance of composite printed wiring board 100 to changes in surrounding environment.

If through hole H is provided in second printed wiring board 2, it is necessary to provide through hole H so as to avoid parts (e.g., bonding member 64 (see FIG. 2) and part 66 (see FIG. 2)) disposed on the side opposite to first printed wiring board 1 with respect to second printed wiring board 2. This may limit layout of wiring in the substrate and mounted parts. Thus, the degree of difficulty of designing composite printed wiring board 100 may increase.

Contrastingly, in composite printed wiring board 100 according to the present embodiment, through hole H is provided in first printed wiring board 1 as shown in FIG. 1. It is thus not necessary to provide through hole H so as to avoid the parts disposed on the side opposite to first printed wiring board 1 with respect to second printed wiring board 2. This can suppress limitations on the layout of wiring in the substrate and mounted parts. Thus, an increase in the degree of difficulty of designing composite printed wiring board 100 can be suppressed.

First bonding layer 41 and second bonding layer 42 are formed of a metallic compound. The metallic compound has a melting point higher than the glass transition temperature of a resin portion of the conductive adhesive sheet. Thus, the heat resistance of first bonding layer 41 and second bonding layer 42 can be improved more than when first bonding layer 41 and second bonding layer 42 are formed of a conductive adhesive sheet.

First bonding layer 41 and second bonding layer 42 are formed of the metallic compound. Thus, the melting point (e.g., 415° C. or higher and 795° C. or lower) of first bonding layer 41 and second bonding layer 42 can be made higher than the heating temperature (e.g., 240° C. or higher and 260° C. or lower) in a reflow soldering step. This can suppress melting of first bonding layer 41 and second bonding layer 42 in the reflow soldering step.

Composite printed wiring board 100 according to the present embodiment is applied to an antenna device mounted in a mobile object, such as an aircraft. The changes in atmospheric pressure of the outside air and changes in temperature of the outside air affect the antenna mounted in the mobile object such as an aircraft. Thus, the changes in atmospheric pressure and temperature also affect cavity 5 of composite printed wiring board 100. In composite printed wiring board 100 according to the present embodiment, since the pressure inside cavity 5 and the pressure outside cavity 5 can be made equal to each other, the deformations of first printed wiring board 1 and second printed wiring board 2 due to changes in atmospheric pressure can be suppressed even when the changes in atmospheric pressure and temperature affect composite printed wiring board 100.

According to the method of manufacturing composite printed wiring board 100 according to the present embodiment, in bonding step S102, intermediate plate 3 is bonded to first printed wiring board 1 and second printed wiring board 2 by first bonding layer 41 and second bonding layer 42, respectively, with cavity 5 communicating with through hole H, as shown in FIG. 6. This allows the inside of cavity 5 to be connected to the outside of cavity 5 by through hole H. Thus, the pressure inside cavity 5 can be made equal to the pressure outside cavity 5. This can suppress the deformations of first printed wiring board 1 and second printed wiring board 2 due to a pressure difference between the pressure inside cavity 5 and the pressure outside cavity 5 in the process of manufacturing composite printed wiring board 100. Consequently, the deformations of first printed wiring board 1 and second printed wiring board 2 can be suppressed in the process of manufacturing composite printed wiring board 100.

Figure 9:
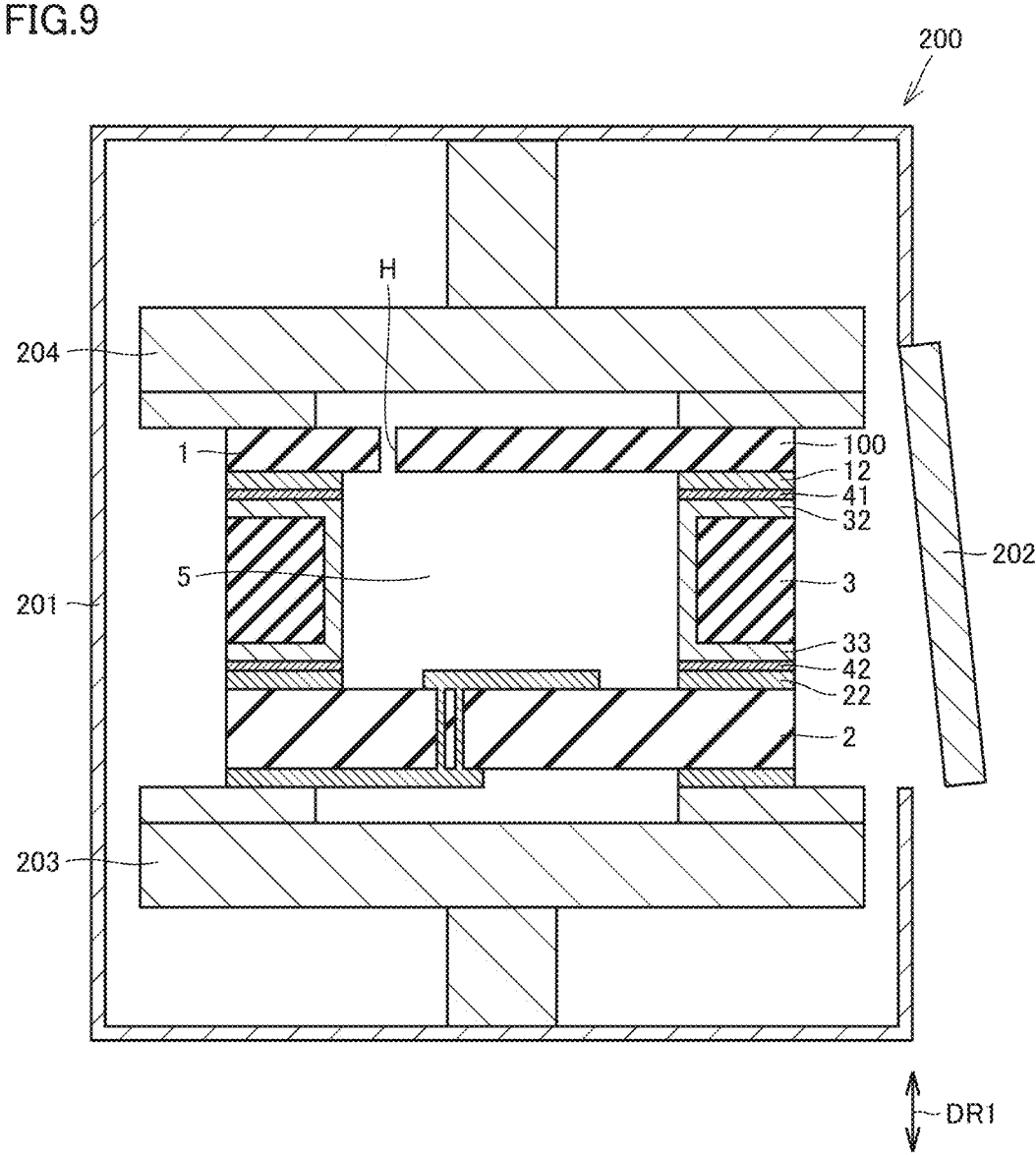
FIG. 9 is a sectional view schematically showing a state in which a first bonding layer and a second bonding layer of the composite printed wiring board are compressed by the pressing machine in the press furnace in the method of manufacturing a composite printed wiring board according to the variation of Embodiment 1.

According to the method of manufacturing composite printed wiring board 100 according to the variation of the present embodiment, in bonding step S102, intermediate plate 3 is bonded to first printed wiring board 1 and second printed wiring board 2 by first bonding layer 41 and second bonding layer 42, respectively, with the pressures inside and outside cavity 5 equal to the atmospheric pressure, as shown in FIG. 9. This can suppress a pressure difference occurring between the pressures inside and outside cavity 5. Consequently, the deformations of first printed wiring board 1 and second printed wiring board 2 due to pressure difference can be suppressed.

Embodiment 2

Next, a configuration of composite printed wiring board 100 according to Embodiment 2 will be described with reference to FIG. 10. Unless otherwise described, Embodiment 2 has the same configuration, manufacturing method, and functions and effects as those of Embodiment 1 described above. Thus, the same components as those of Embodiment 1 described above will be designated by the same reference characters, and description thereof will not be repeated.

Figure 10:
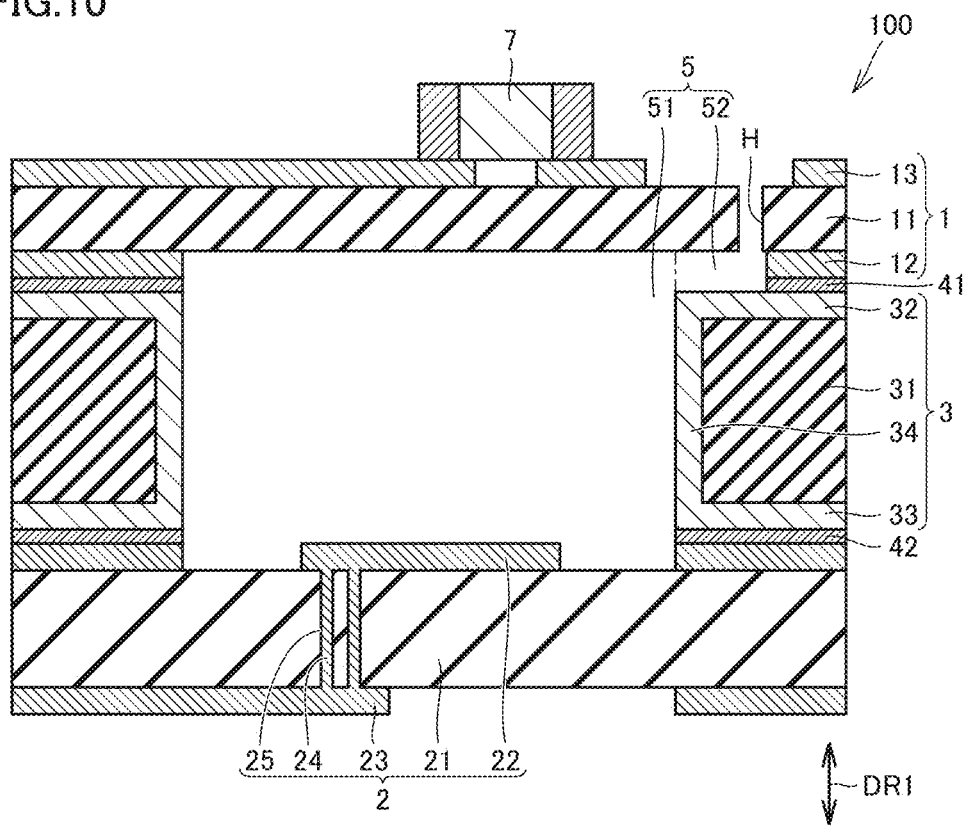
FIG. 10 is a sectional view schematically showing a configuration of a composite printed wiring board according to Embodiment 2.

As shown in FIG. 10, composite printed wiring board 100 according to the present embodiment includes first printed wiring board 1 having through hole H, second printed wiring board 2, intermediate plate 3, first bonding layer 41, and second bonding layer 42. First bonding layer 41 and second bonding layer 42 are formed of a metallic compound.

Cavity 5 includes a main body 51 and a ventilation portion 52. In FIG. 10, the boundary between main body 51 and ventilation portion 52 is indicated by the single-dot chain line. Main body 51 is sandwiched between first printed wiring board 1 and second printed wiring board 2. Main body 51 is sandwiched between first printed wiring board 1 and second printed wiring board 2 in first direction DR1. Intermediate plate 3 surrounds main body 51.

Ventilation portion 52 is sandwiched between intermediate plate 3 and any of first printed wiring board 1 and second printed wiring board 2. In the present embodiment, ventilation portion 52 is sandwiched between first printed wiring board 1 and intermediate plate 3. Ventilation portion 52 projects from main body 51 in the in-plane direction of first printed wiring board 1. Ventilation portion 52 is provided by partially removing first wiring layer 12 by etching or the like. Ventilation portion 52 may be provided by partially removing first bonding layer 41 by etching or the like.

Through hole H is connected to main body 51 by ventilation portion 52. Through hole H communicates with main body 51 via ventilation portion 52. Through hole H is provided so as to overlap intermediate plate 3 in the direction (first direction DR1) in which first printed wiring board 1 and second printed wiring board 2 sandwich intermediate plate 3 in between. Through hole H is provided so as to be displaced from main body 51 in first direction DR1.

Composite printed wiring board 100 according to the present embodiment further includes electronic part 7. Electronic part 7 is bonded to first printed wiring board 1. Electronic part 7 is disposed on the side opposite to main body 51 with respect to first printed wiring board 1. Electronic part 7 is disposed outside of cavity 5.

First printed wiring board 1 may be a multilayer substrate. First printed wiring board 1 further includes a first surface wiring layer 13. First surface wiring layer 13 is disposed on the side opposite to first wiring layer 12 with respect to first insulation layer 11. Electronic part 7 is bonded to first surface wiring layer 13.

Although not shown in the figure, a surface of first wiring layer 12 may be covered with a first plated layer. This suppresses corrosion of first wiring layer 12. The first plated layer is, for example, a nickel (Ni)-gold (Au) flash plating.

The shapes of through hole H and ventilation portion 52 may be determined as appropriate. Although not shown in the figure, through hole H may include a plurality of through portions. Ventilation portion 52 may include a plurality of ventilation portions. In order to suppress intrusion of a foreign matter, such as condensed water and dust, into cavity 5 through through hole H and ventilation portion 52, through hole H desirably has a smaller hole diameter, and the number of through portions and the number of ventilation portions are desirably lower.

Next, functions and effects of the present embodiment will be described.

In composite printed wiring board 100 according to the present embodiment, through hole H is provided so as to overlap intermediate plate 3 in the direction (first direction DR1) in which first printed wiring board 1 and second printed wiring board 2 sandwich intermediate plate 3 in between, as shown in FIG. 10. Thus, through hole H is provided in first printed wiring board 1 so as to be displaced from main body 51. Consequently, electronic part 7, wiring in the substrate, and the like can be disposed on the side opposite to first printed wiring board 1 with respect to main body 51. This improves the design flexibility of composite printed wiring board 100. This can also achieve suppression of deformation of composite printed wiring board 100 and improvement in design flexibility of composite printed wiring board 100 at the same time.

Embodiment 3

Next, a configuration of composite printed wiring board 100 according to Embodiment 3 will be described with reference to FIG. 11. Unless otherwise described, Embodiment 3 has the same configuration, manufacturing method, and functions and effects as those of Embodiment 1 described above. Thus, the same components as those of Embodiment 1 described above will be designated by the same reference characters, and description thereof will not be repeated.

Figure 11:
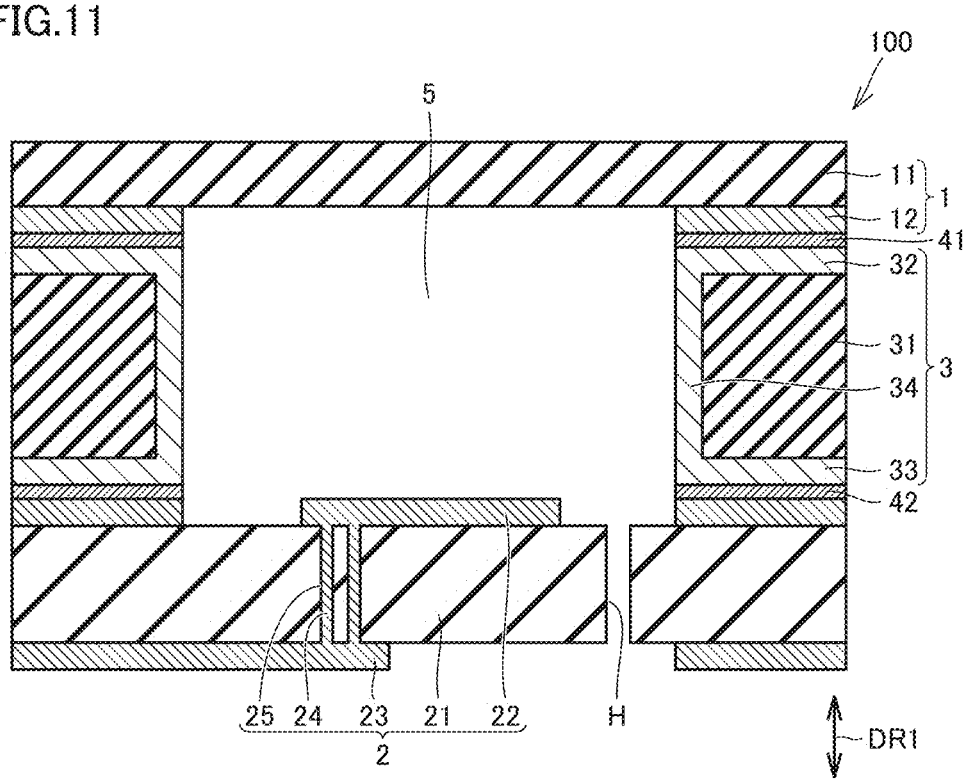
FIG. 11 is a sectional view schematically showing a configuration of a composite printed wiring board according to Embodiment 3.

As shown in FIG. 11, composite printed wiring board 100 according to the present embodiment includes first printed wiring board 1, second printed wiring board 2 having through hole H, intermediate plate 3, first bonding layer 41, and second bonding layer 42. Through hole H is provided in second printed wiring board 2. Through hole H is not provided in first printed wiring board 1. First bonding layer 41 and second bonding layer 42 are formed of a metallic compound.

First printed wiring board 1 may be a multilayer substrate. Although not shown in the figure, a surface of first wiring layer 12 may be covered with a first plated layer. This suppresses corrosion of first wiring layer 12. The first plated layer is, for example, a nickel (Ni)-gold (Au) flash plating.

Second printed wiring board 2 may be a multilayer substrate. Although not shown in the figure, a surface of second wiring layer 22 may be covered with a second plated layer. This suppresses corrosion of second wiring layer 22. The second plated layer is, for example, a nickel (Ni)-gold (Au) flash plating.

The shape of through hole H may be determined as appropriate. Although not shown in the figure, through hole H may include a plurality of through portions. In order to suppress intrusion of a foreign matter, such as condensed water and dust, into cavity 5 through through hole H, through hole H desirably has a smaller hole diameter, and the number of through portions is desirably lower.

Next, functions and effects of the present embodiment will be described.

In composite printed wiring board 100 according to the present embodiment, through hole H is provided in second printed wiring board 2 as shown in FIG. 11. Thus, when composite printed wiring board 100 includes base plate 68 (see FIG. 2), the periphery of through hole H can be covered with base plate 68 (see FIG. 2). This can suppress intrusion of a foreign matter, such as dust and condensed water, into cavity 5 through through hole H, even when composite printed wiring board 100 is disposed outdoors. This can also suppress intrusion of a foreign matter into cavity 5 without sealing through hole H.

Embodiment 4

Next, a configuration of composite printed wiring board 100 according to Embodiment 4 will be described with reference to FIG. 12. Unless otherwise described, Embodiment 4 has the same configuration, manufacturing method, and functions and effects as those of Embodiment 3 described above. Thus, the same components as those of Embodiment 3 described above will be designated by the same reference characters, and description thereof will not be repeated.

Figure 12:
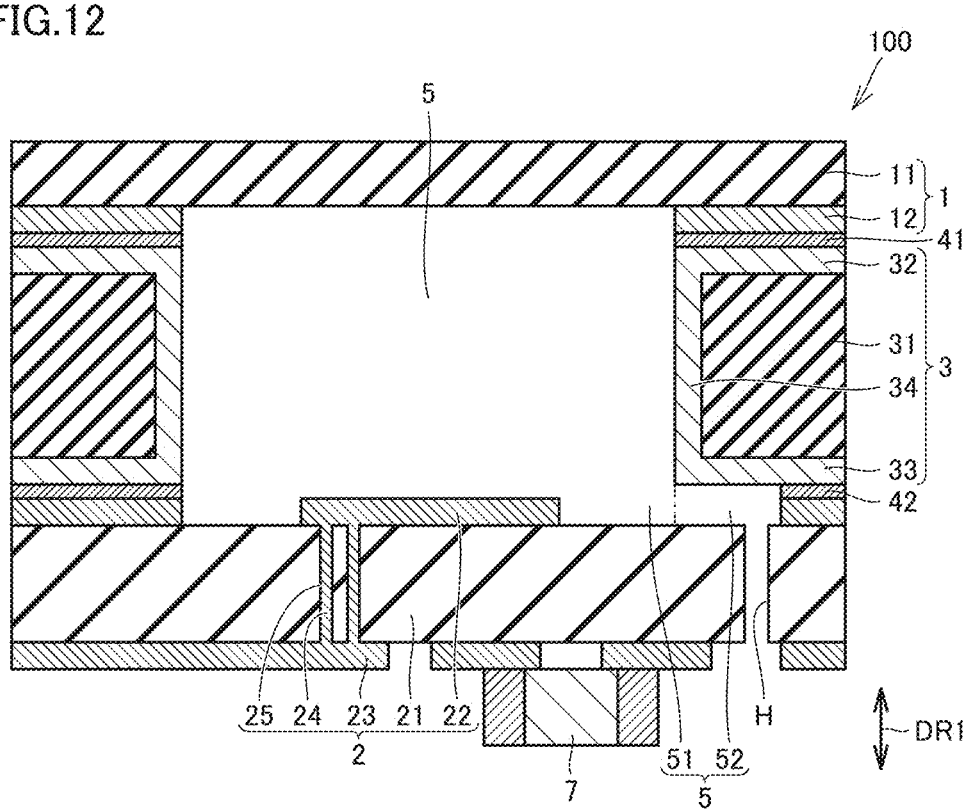
FIG. 12 is a sectional view schematically showing a configuration of a composite printed wiring board according to Embodiment 4.

As shown in FIG. 12, composite printed wiring board 100 according to the present embodiment includes first printed wiring board 1, second printed wiring board 2 having through hole H, intermediate plate 3, first bonding layer 41, and second bonding layer 42. First bonding layer 41 and second bonding layer 42 are formed of a metallic compound.

Cavity 5 includes main body 51 and ventilation portion 52. In FIG. 12, the boundary between main body 51 and ventilation portion 52 is indicated by the single-dot chain line. Ventilation portion 52 is sandwiched between second printed wiring board 2 and intermediate plate 3. Ventilation portion 52 is provided by partially removing second wiring layer 22 by etching or the like. Ventilation portion 52 may be provided by partially removing second bonding layer 42 by etching or the like.

Second printed wiring board 2 may be a multilayer substrate. Although not shown in the figure, a surface of second wiring layer 22 may be covered with a second plated layer. This suppresses corrosion of second wiring layer 22. The second plated layer is, for example, a nickel (Ni)-gold (Au) flash plating.

The shapes of through hole H and ventilation portion 52 may be determined as appropriate. Although not shown in the figure, through hole H may include a plurality of through portions. Ventilation portion 52 may include a plurality of ventilation portions. In order to suppress intrusion of a foreign matter, such as condensed water and dust, into cavity 5 through through hole H and ventilation portion 52, through hole H desirably has a smaller hole diameter, and the number of through portions and the number of ventilation portions are desirably lower.

Next, functions and effects of the present embodiment will be described.

In composite printed wiring board 100 according to the present embodiment, through hole H is provided so as to overlap intermediate plate 3 in the direction (first direction DR1) in which first printed wiring board 1 and second printed wiring board 2 sandwich intermediate plate 3 in between, as shown in FIG. 12. Thus, through hole H is provided in second printed wiring board 2 so as to be displaced from main body 51. Consequently, electronic part 7, wiring in the substrate, and the like can be disposed on the side opposite to second printed wiring board 2 with respect to main body 51. This improves the design flexibility of composite printed wiring board 100. This can also achieve suppression of deformation of composite printed wiring board 100 and improvement in design flexibility of composite printed wiring board 100 at the same time.

Embodiment 5

Next, a configuration of composite printed wiring board 100 according to Embodiment 5 will be described with reference to FIG. 13. Unless otherwise described, Embodiment 5 has the same configuration, manufacturing method, and functions and effects as those of Embodiment 1 described above. Thus, the same components as those of Embodiment 1 described above will be designated by the same reference characters, and description thereof will not be repeated.

Figure 13:
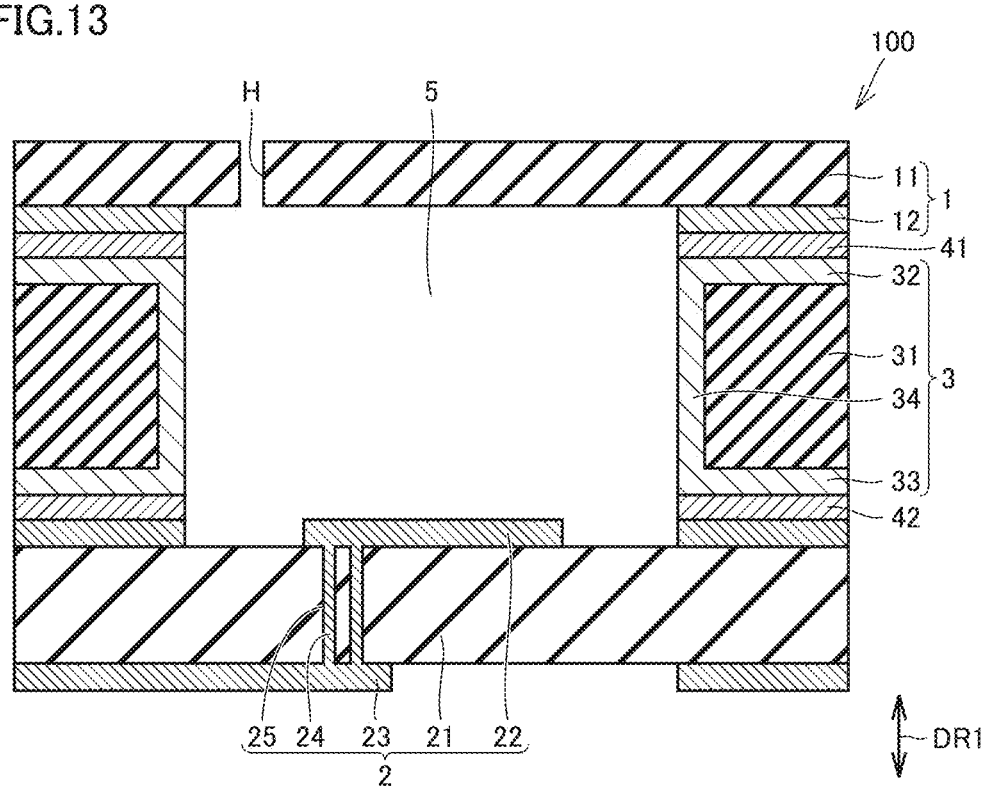
FIG. 13 is a sectional view schematically showing a configuration of a composite printed wiring board according to Embodiment 5.

As shown in FIG. 13, composite printed wiring board 100 mainly includes first printed wiring board 1 having through hole H, second printed wiring board 2, intermediate plate 3, first bonding layer 41, and second bonding layer 42.

First printed wiring board 1 is a printed circuit board. First printed wiring board 1 may be a multilayer substrate. Although not shown in the figure, a surface of first wiring layer 12 may be covered with a first plated layer. This suppresses corrosion of first wiring layer 12. The first plated layer is, for example, a nickel (Ni)-gold (Au) flash plating. In order to improve the adhesion between first wiring layer 12 and first bonding layer 41, physical roughening or chemical roughening may be performed on first wiring layer 12. Physical roughening is, for example, polishing. Chemical roughening is, for example, etching.

Second printed wiring board 2 is a printed circuit board. Second printed wiring board may be a multilayer substrate. In the present embodiment, second printed wiring board 2 has no through hole H. Although not shown in the figure, a surface of second wiring layer 22 may be covered with a second plated layer. This suppresses corrosion of second wiring layer 22. The second plated layer is, for example, a nickel (Ni)-gold (Au) flash plating. In order to improve the adhesion between second wiring layer 22 and second bonding layer 42, physical roughening or chemical roughening may be performed on second wiring layer 22.

Intermediate plate 3 is a substrate. Intermediate plate 3 has such an annular shape as to surround cavity 5. Intermediate plate 3 is processed into an annular shape by, for example, machining. After processing of intermediate plate 3 into an annular shape, for example, first intermediate wiring layer 32, second intermediate wiring layer 33, and lateral wiring layer 34 may be formed by copper (Cu) plating in plating of through hole 25. Then, intermediate plate 3 is subjected to nickel (Ni)-gold (Au) flash plating.

In order to improve the adhesion between first intermediate wiring layer 32, second intermediate wiring layer 33 and first bonding layer 41, second bonding layer 42, physical roughening or chemical roughening may be performed on first intermediate wiring layer 32, second intermediate wiring layer 33, and lateral wiring layer 34.

First bonding layer 41 bonds first printed wiring board 1 to intermediate plate 3. Second bonding layer 42 bonds second printed wiring board 2 to intermediate plate 3. In the present embodiment, each of first bonding layer 41 and second bonding layer 42 is a conductive adhesive sheet formed of a resin and electrically conductive fillers. The glass transition temperature of the resin portions of first bonding layer 41 and second bonding layer 42 is, for example, 120° C. The electrically conductive fillers are, for example, powdered or flaked copper (Cu) particles coated with silver (Ag). The resin is, for example, a thermosetting resin. Examples of the thermosetting resin include epoxy, polyurethane, and polyester.

Cavity 5 is provided in first printed wiring board 1, second printed wiring board 2, intermediate plate 3, first bonding layer 41, and second bonding layer 42. Cavity 5 is a hollow provided in composite printed wiring board 100. Cavity 5 is formed by, for example, machining.

In the present embodiment, through hole H is provided in first printed wiring board 1. Through hole H is not provided in second printed wiring board 2. Through hole H communicates with cavity 5.

The shape of through hole H may be determined as appropriate. Although not shown in the figure, through hole H may include a plurality of through portions. In order to suppress intrusion of a foreign matter, such as condensed water and dust, into cavity 5 through through hole H, through hole H desirably has a smaller hole diameter, and the number of through portions is desirably lower.

Cavity 5 and through hole H are configured as a path for gas. When composite printed wiring board 100 is applied to an antenna device, cavity 5 and through hole H are used as a path for electric signals (radio waves).

Next, a method of manufacturing composite printed wiring board 100 according to Embodiment 5 will be described with reference to FIGS. 14 to 17.

The method of manufacturing composite printed wiring board 100 includes preparation step S101 and bonding step S102.

Figure 14:
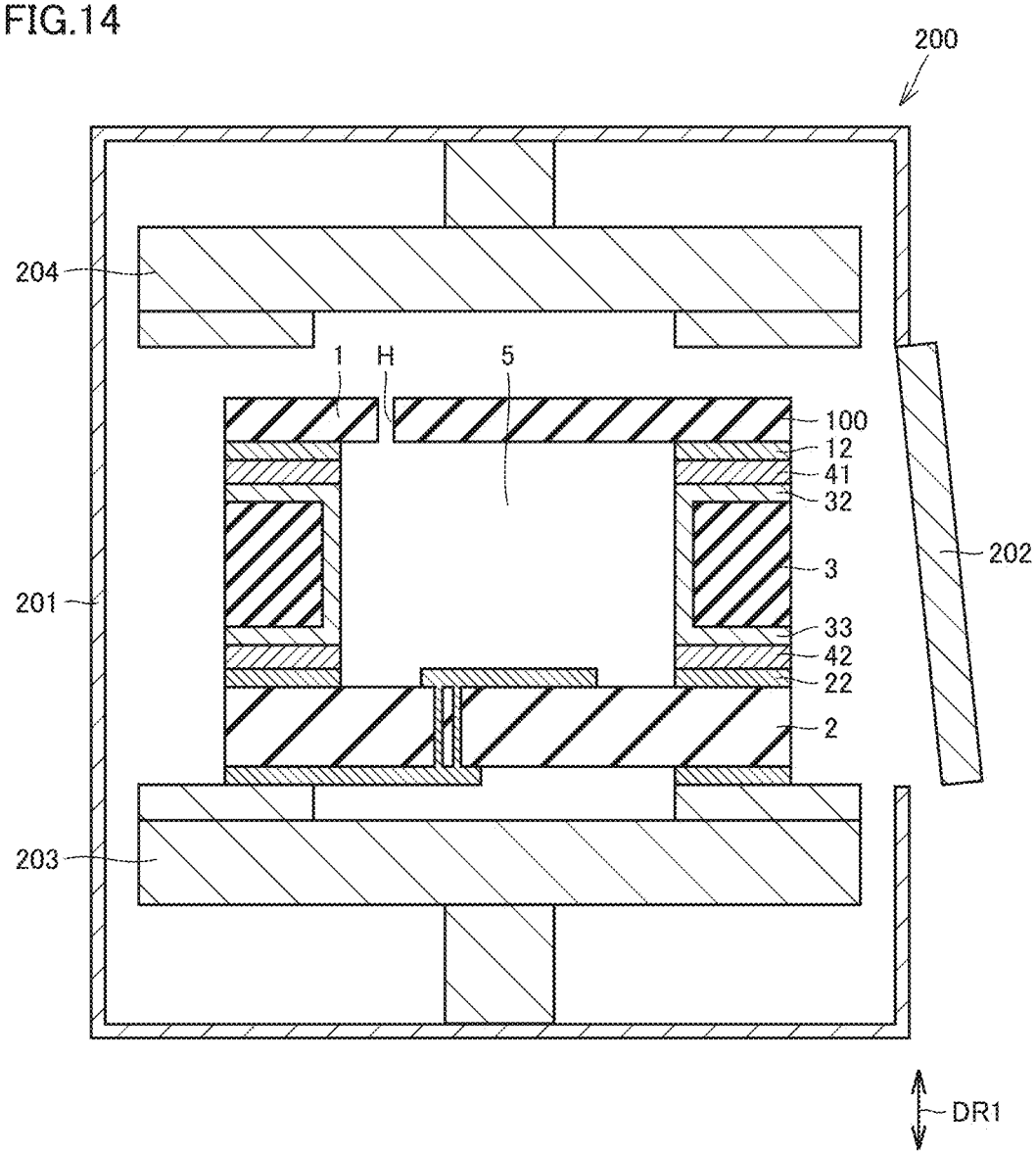
FIG. 14 is a sectional view schematically showing a state in which a composite printed wiring board according to Embodiment 5 is disposed on a stage in a press furnace.

As shown in FIG. 14, in preparation step S101, first printed wiring board 1, second printed wiring board 2, intermediate plate 3, first bonding layer 41 between first printed wiring board 1 and intermediate plate 3, and second bonding layer 42 between second printed wiring board 2 and intermediate plate 3 are prepared. First printed wiring board 1, second printed wiring board 2, and intermediate plate 3 are laid up such that intermediate plate 3 is disposed between first printed wiring board 1 and second printed wiring board 2. The laying-up step is similar to a step of stacking a common multilayer substrate.

First bonding layer 41, which is a conductive adhesive sheet, is disposed between first printed wiring board 1 and intermediate plate 3. Second bonding layer 42, which is a conductive adhesive sheet, is disposed between second printed wiring board 2 and intermediate plate 3. At this time, first bonding layer 41 may be temporarily bonded to first printed wiring board 1. Similarly, second bonding layer 42 may be temporarily bonded to second printed wiring board 2.

First printed wiring board 1, second printed wiring board 2, intermediate plate 3, first bonding layer 41, and second bonding layer 42 are disposed in housing 201 of press furnace 200 at atmospheric pressure. Second printed wiring board 2 is disposed on stage 203 in housing 201 of press furnace 200.

Figure 15:
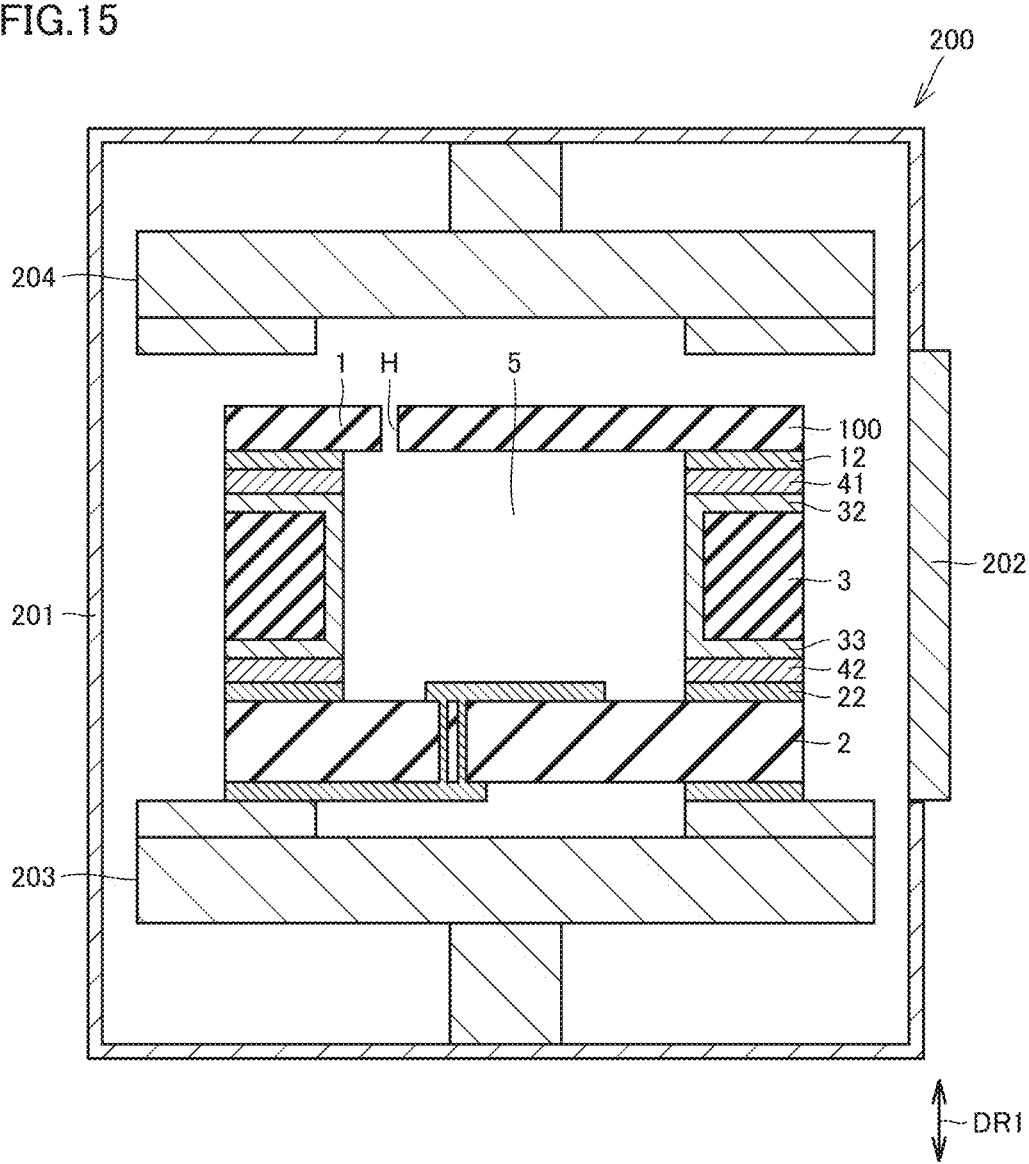
FIG. 15 is a sectional view schematically showing a state in which the composite printed wiring board according to Embodiment 5 is disposed in a sealed press furnace.

Subsequently, as shown in FIG. 15, press furnace 200 with door 202 closed (in a sealed state) is subjected to evacuation, thus creating a vacuum in housing 201 of press furnace 200. This creates a vacuum in cavity 5.

Figure 16:
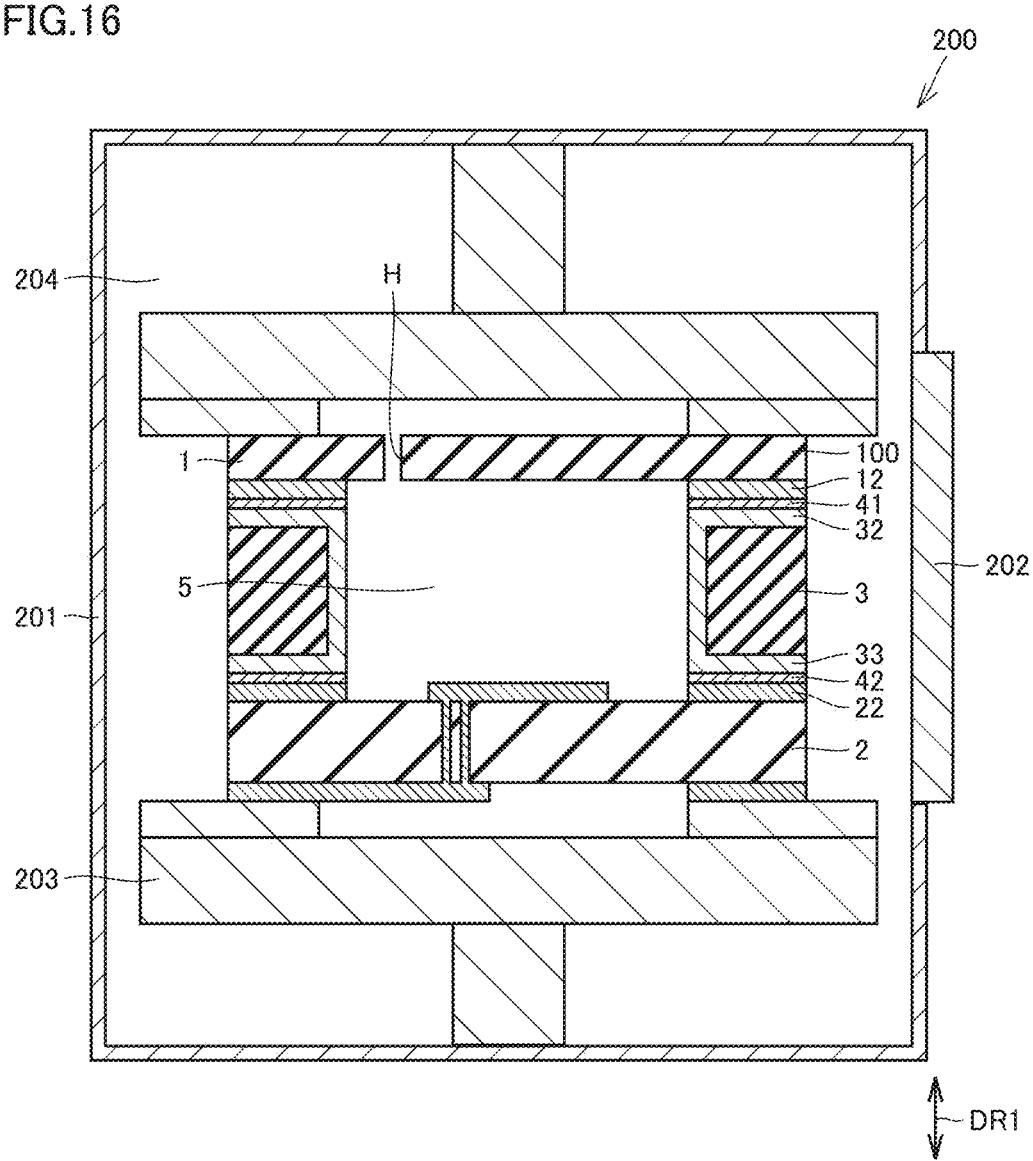
FIG. 16 is a sectional view schematically showing a state in which the composite printed wiring board according to Embodiment 5 is pressurized by a pressing machine in the sealed press furnace.

Subsequently, in bonding step S102, intermediate plate 3 is bonded to first printed wiring board 1 and second printed wiring board 2 by first bonding layer 41 and second bonding layer 42, respectively, with cavity 5 communicating with through hole H, as shown in FIG. 16. Thus, first printed wiring board 1 is electrically connected to intermediate plate 3 by first bonding layer 41, and second printed wiring board 2 is electrically connected to intermediate plate 3 by second bonding layer 42. First wiring layer 12 is electrically connected to first intermediate wiring layer 32, and second wiring layer 22 is electrically connected to second intermediate wiring layer 33.

In the present embodiment, a vacuum pressurization and heating press is used in bonding step S102. With the inside and outside of cavity 5 under vacuum, intermediate plate 3 is bonded to first printed wiring board 1 and second printed wiring board 2 by first bonding layer 41 and second bonding layer 42, respectively. Specifically, composite printed wiring board 100 is heated in press furnace 200 under vacuum. Composite printed wiring board 100 is heated at a temperature based on the glass transition temperature of the resin. Under vacuum, composite printed wiring board 100 is pressurized by pressing machine 204. Under vacuum, thus, first printed wiring board 1 is bonded to intermediate plate 3 by first bonding layer 41, and second printed wiring board 2 is bonded to intermediate plate 3 by second bonding layer 42.

Figure 17:
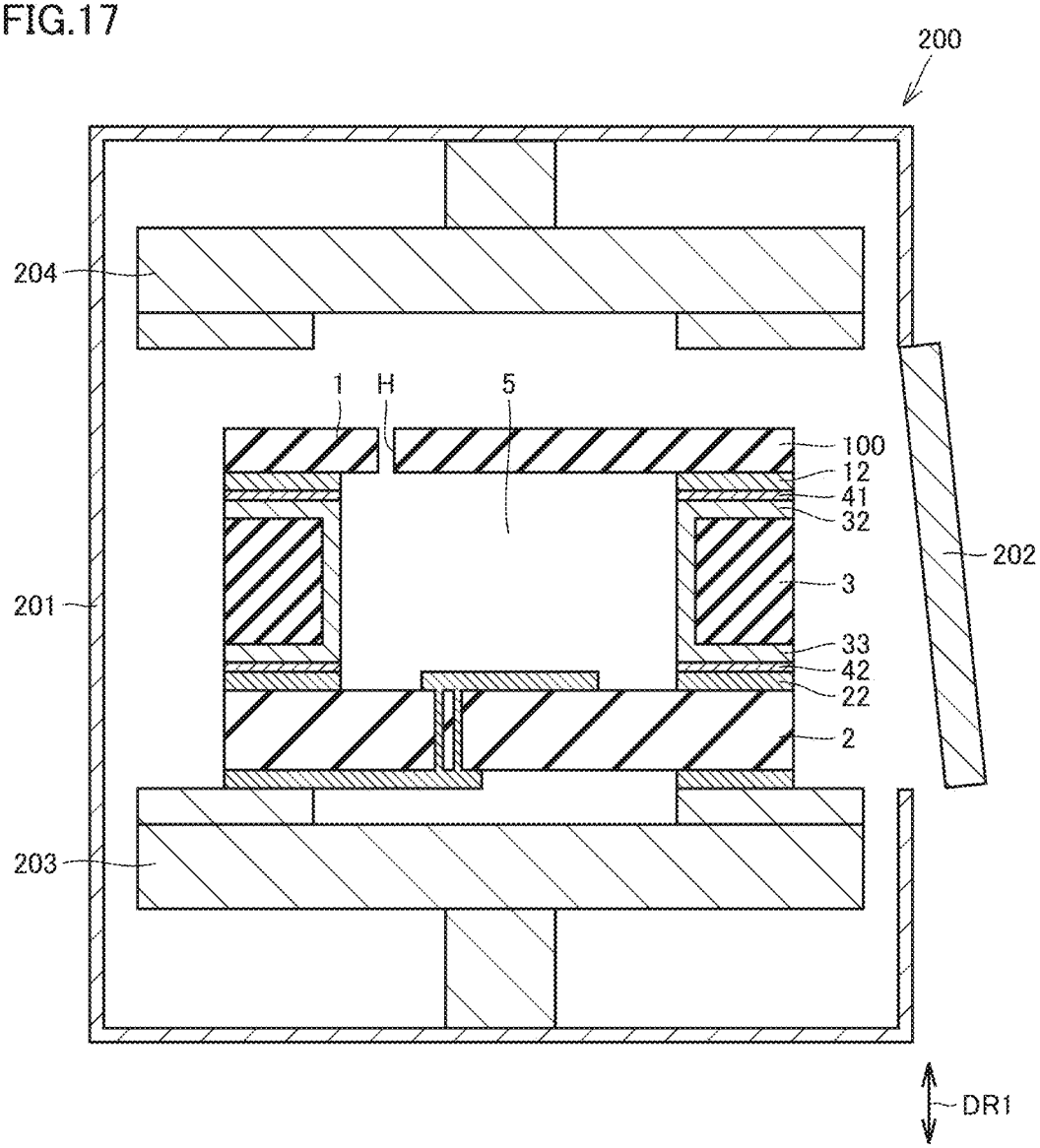
FIG. 17 is a sectional view schematically showing a state in which a first printed wiring board of the composite wiring according to Embodiment 5 is bonded to an intermediate plate by a first bonding layer and a second printed wiring board of the composite wiring is bonded to the intermediate plate by a second bonding layer.

Subsequently, as door 202 of press furnace 200 is opened, the pressure inside housing 201 of press furnace 200 becomes equal to atmospheric pressure, as shown in FIG. 17. Also, composite printed wiring board 100 is released from pressurization by pressing machine 204. Thus, the pressure inside cavity 5 becomes equal to atmospheric pressure. Subsequently, a post-process in common substrate manufacture is performed on composite printed wiring board 100. The post-process is, for example, machining. Consequently, composite printed wiring board 100 is complete.

Next, a method of manufacturing composite printed wiring board 100 according to a variation of Embodiment 5 will be described with reference to FIGS. 18 and 19.

In the present embodiment, an atmospheric-pressure pressurization and heating press is used in bonding step S102. As shown in FIG. 18, press furnace 200 with door 202 opened is used in bonding step S102. At atmospheric pressure, composite printed wiring board 100 is heated in press furnace 200. Also, as shown in FIG. 19, composite printed wiring board 100 is pressurized by pressing machine 204 at atmospheric pressure. Consequently, at atmospheric pressure, first printed wiring board 1 is bonded to intermediate plate 3 by first bonding layer 41, and second printed wiring board 2 is bonded to intermediate plate 3 by second bonding layer 42. In bonding step S102, the pressure inside cavity 5 is maintained at atmospheric pressure.

Next, functions and effects of the present embodiment will be described.

In composite printed wiring board 100 according to the present embodiment, through hole H communicates with cavity 5, as shown in FIG. 13. This causes the inside of cavity 5 to be connected to the outside of cavity 5 by through hole H provided in first printed wiring board 1. Thus, the pressure inside cavity 5 can be made equal to the pressure outside cavity 5. This can suppress deformations of first printed wiring board 1 and second printed wiring board 2 due to a pressure difference between the pressure inside cavity 5 and the pressure outside cavity 5. Consequently, the deformations of first printed wiring board 1 and second printed wiring board 2 can be suppressed.

Since the deformations of first printed wiring board 1 and second printed wiring board 2 can be suppressed, printing failures in cream solder printing required for mounting of electronic parts can be suppressed in a part mounting step, which is a post-process. Also, the deformations of first printed wiring board 1 and second printed wiring board 2, which are caused by the pressure due to expansion of the air inside cavity 5 at a reflow soldering temperature in reflow soldering, can be suppressed. Thus, mounting failures occurring in reflow soldering can be suppressed. Also, the deformation of the substrate can be suppressed even when the pressure inside cavity 5 changes due to changes in the environment around composite printed wiring board 100 (the atmospheric pressure and temperature around composite printed wiring board 100). This improves the tolerance of composite printed wiring board 100 to the surrounding environment.

First bonding layer 41 and second bonding layer 42 are formed of a conductive adhesive sheet. The glass transition temperature of a resin portion of the conductive adhesive sheet is, for example, 120° C. or lower. The glass transition temperature of first printed wiring board 1, second printed wiring board 2, and intermediate plate 3 is, for example, 180° C. Thus, the glass transition temperature of first bonding layer 41 and second bonding layer 42 is lower than the glass transition temperature of first printed wiring board 1, second printed wiring board 2, and intermediate plate 3. This can suppress a thermal load acting on first printed wiring board 1, second printed wiring board 2, and intermediate plate 3 in bonding using first bonding layer 41 and second bonding layer 42. Consequently, manufacturing failures can be reduced. Also, a higher strength can be obtained than when first bonding layer 41 and second bonding layer 42 are formed of a metallic compound.

According to the method of manufacturing composite printed wiring board 100 according to the present embodiment, in bonding step S102, intermediate plate 3 is bonded to first printed wiring board 1 and second printed wiring board 2 by first bonding layer 41 and second bonding layer 42, respectively, with cavity 5 communicating with through hole H, as shown in FIG. 16. This allows the inside of cavity 5 to be connected to the outside of cavity 5 by through hole H. Thus, the pressure inside cavity 5 can be made equal to the pressure outside cavity 5. Consequently, the deformations of first printed wiring board 1 and second printed wiring board 2 can be suppressed in the process of manufacturing composite printed wiring board 100.

As shown in FIG. 16, in bonding step S102, intermediate plate 3 is bonded to first printed wiring board 1 and second printed wiring board 2 by first bonding layer 41 and second bonding layer 42, respectively, with the inside and outside of cavity 5 under vacuum. This results in decompression of first bonding layer 41 and second bonding layer 42. Thus, first bonding layer 41 and second bonding layer 42 are defoamed. Consequently, air babbles (voids) in first bonding layer 41 and second bonding layer 42 can be reduced.

Figure 18:
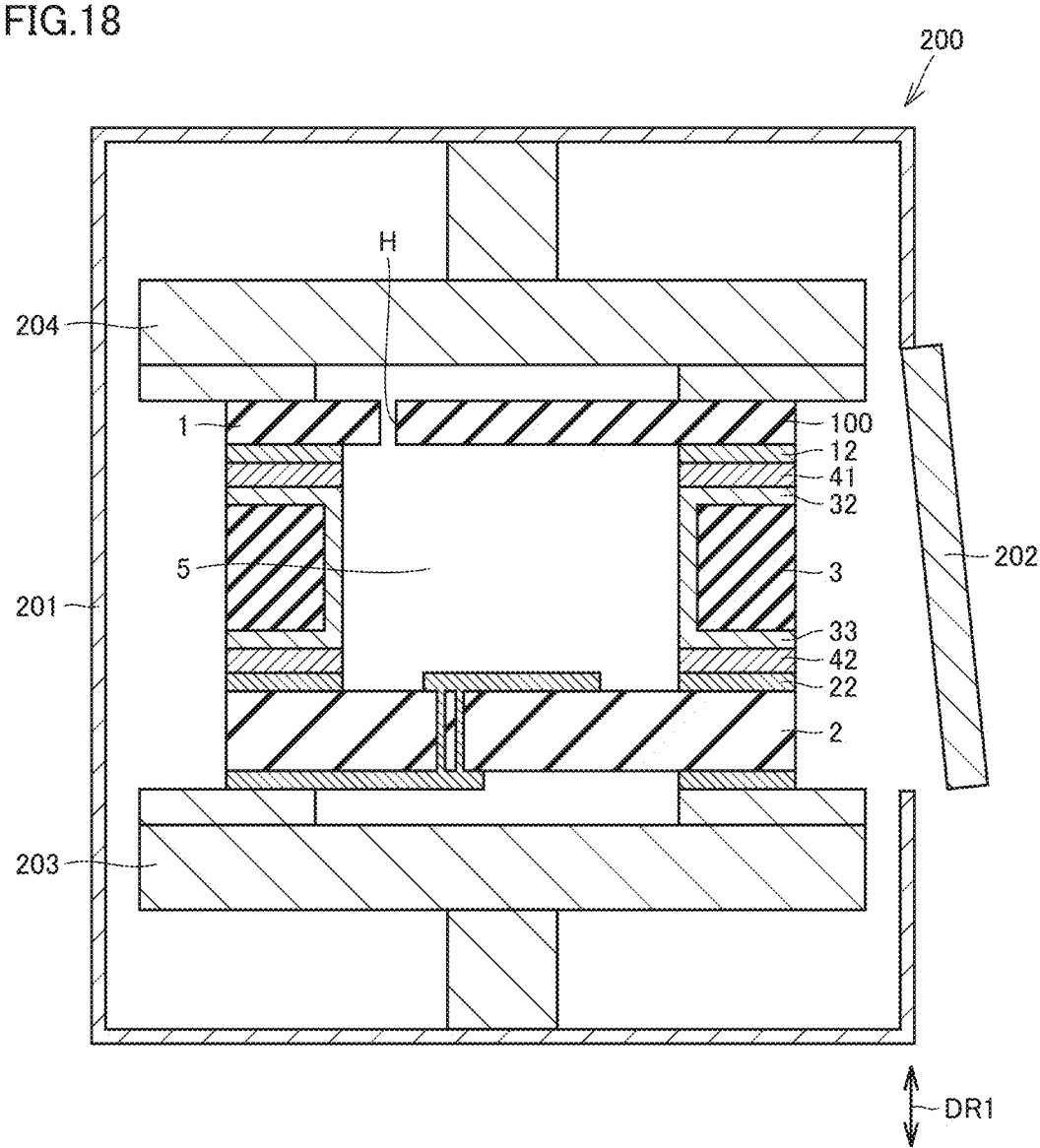
FIG. 18 is a sectional view schematically showing a state in which a composite printed wiring board is pressurized by a pressing machine in a press furnace in a method of manufacturing a composite printed wiring board according to a variation of Embodiment 5.
Figure 19:
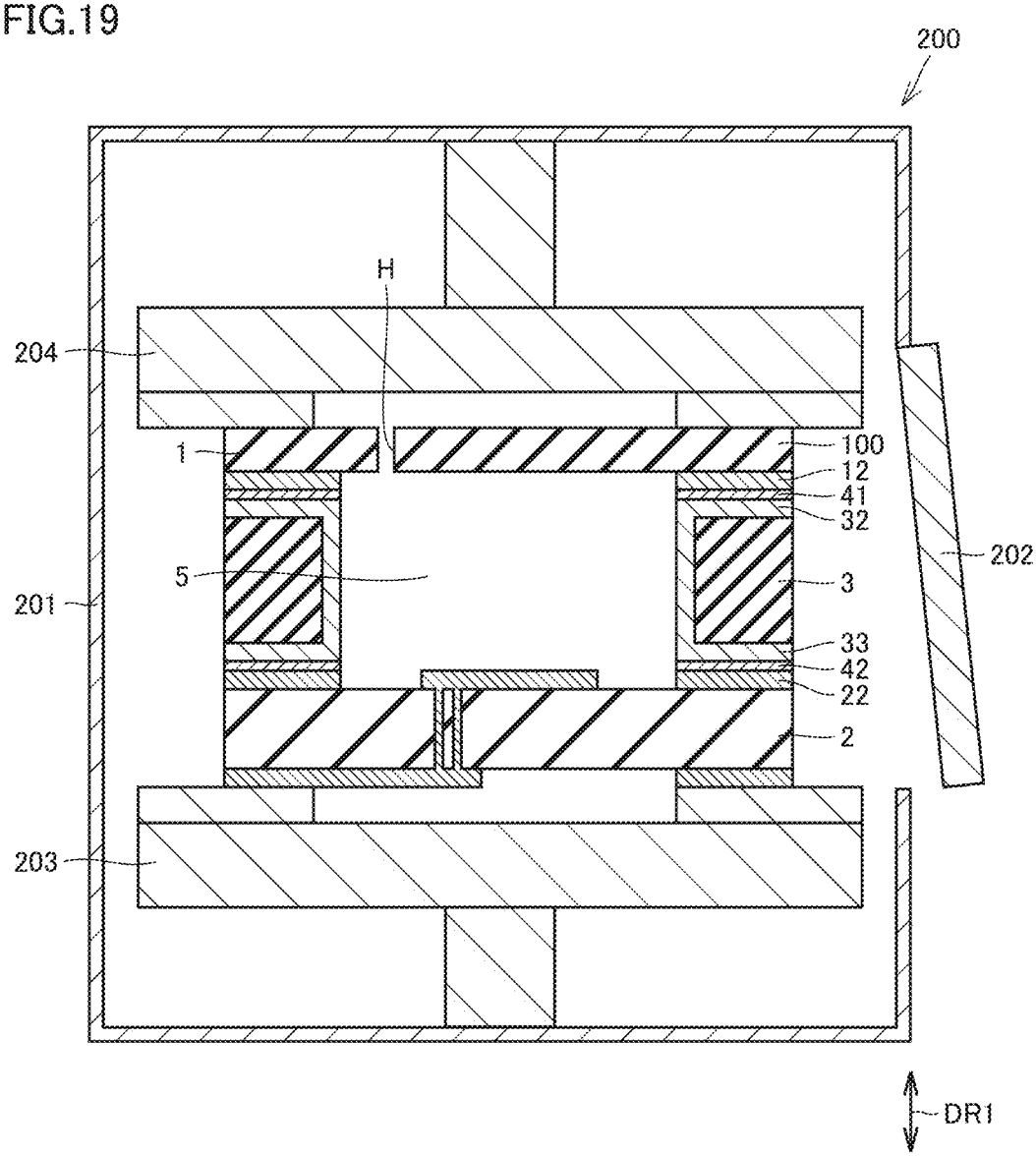
FIG. 19 is a sectional view schematically showing a state in which a first bonding layer and a second bonding layer of the composite printed wiring board are compressed by the pressing machine in the press furnace in the method of manufacturing a composite printed wiring board according to the variation of Embodiment 5.

According to the method of manufacturing composite printed wiring board 100 according to the variation of the present embodiment, in bonding step S102, intermediate plate 3 is bonded to first printed wiring board 1 and second printed wiring board 2 by first bonding layer 41 and second bonding layer 42, respectively, with the pressure inside cavity 5 and the pressure outside cavity 5 equal to atmospheric pressure, as shown in FIG. 18. This can suppress a pressure difference occurring between the pressures inside and outside cavity 5. Consequently, the deformations of first printed wiring board 1 and second printed wiring board 2 due to pressure difference can be suppressed.

Embodiment 6

Next, a configuration of composite printed wiring board 100 according to Embodiment 6 will be described with reference to FIG. 20. Unless otherwise described, Embodiment 6 has the same configuration, manufacturing method, and functions and effects as those of Embodiment 5 described above. Thus, the same components as those of Embodiment 5 described above will be designated by the same reference characters, and description thereof will not be repeated.

Figure 20:
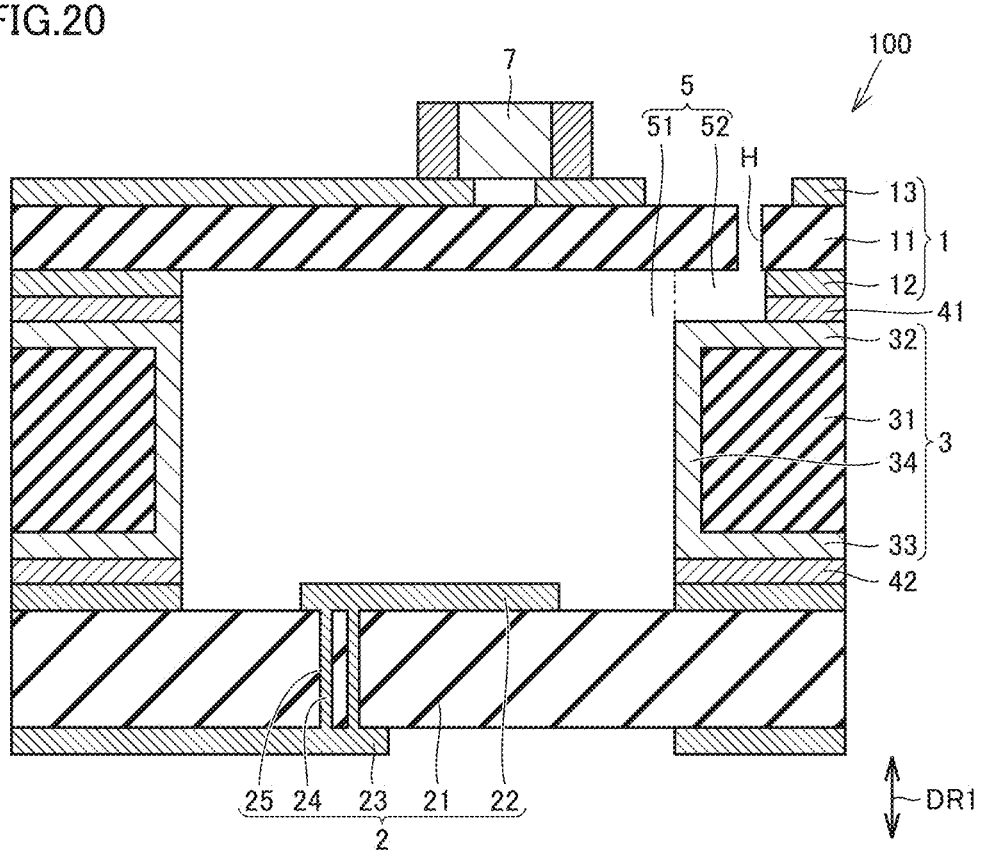
FIG. 20 is a sectional view schematically showing a configuration of a composite printed wiring board according to Embodiment 6.

As shown in FIG. 20, composite printed wiring board 100 according to the present embodiment includes first printed wiring board 1 having through hole H, second printed wiring board 2, intermediate plate 3, first bonding layer 41, and second bonding layer 42. First bonding layer 41 and second bonding layer 42 are formed of a conductive adhesive sheet.

Cavity 5 includes main body 51 and ventilation portion 52. Main body 51 is sandwiched between first printed wiring board 1 and second printed wiring board 2. Main body 51 is sandwiched between first printed wiring board 1 and second printed wiring board 2 in first direction DR1. Intermediate plate 3 surrounds main body 51.

Ventilation portion 52 is sandwiched between intermediate plate 3 and any of first printed wiring board 1 and second printed wiring board 2. In the present embodiment, ventilation portion 52 is sandwiched between first printed wiring board 1 and intermediate plate 3. Ventilation portion 52 projects from main body 51 in the in-plane direction of first printed wiring board 1. Ventilation portion 52 is provided by partially removing first wiring layer 12 by etching or the like. Ventilation portion 52 may be provided by partially removing first bonding layer 41 by etching or the like.

Through hole H is connected to main body 51 by ventilation portion 52. Through hole H communicates with main body 51 via ventilation portion 52. Through hole H is provided so as to overlap intermediate plate 3 in the direction (first direction DR1) in which first printed wiring board 1 and second printed wiring board 2 sandwich intermediate plate 3 in between. Through hole H is provided so as to be displaced from main body 51 in first direction DR1.

First printed wiring board 1 may be a multilayer substrate. Although not shown in the figure, a surface of first wiring layer 12 may be covered with a first plated layer. This suppresses corrosion of first wiring layer 12. The first plated layer is, for example, a nickel (Ni)-gold (Au) flash plating. In order to improve the adhesion between first wiring layer 12 and first bonding layer 41, physical roughening or chemical roughening may be performed on first wiring layer 12.

Second printed wiring board 2 may be a multilayer substrate. Although not shown in the figure, a surface of second wiring layer 22 may be covered with a second plated layer. This suppresses corrosion of second wiring layer 22. The second plated layer is, for example, a nickel (Ni)-gold (Au) flash plating. In order to improve the adhesion between second wiring layer 22 and second bonding layer 42, physical roughening or chemical roughening may be performed on second wiring layer 22.

The shapes of through hole H and ventilation portion 52 may be determined as appropriate. Although not shown in the figure, through hole H may include a plurality of through portions. Ventilation portion 52 may include a plurality of ventilation portions. In order to suppress intrusion of a foreign matter, such as condensed water and dust, into cavity 5 through through hole H and ventilation portion 52, through hole H desirably has a smaller hole diameter, and the number of through portions and the number of ventilation portions are desirably lower.

Composite printed wiring board 100 according to the present embodiment further includes electronic part 7. Electronic part 7 is bonded to first printed wiring board 1. Electronic part 7 is disposed on the side opposite to main body 51 with respect to first printed wiring board 1. Electronic part 7 is disposed outside of cavity 5.

First printed wiring board 1 further includes first surface wiring layer 13. First surface wiring layer 13 is disposed on the side opposite to first wiring layer 12 with respect to first insulation layer 11. Electronic part 7 is bonded to first surface wiring layer 13.

Next, functions and effects of the present embodiment will be described.

In composite printed wiring board 100 according to the present embodiment, through hole H is provided so as to overlap intermediate plate 3 in the direction (first direction DR1) in which first printed wiring board 1 and second printed wiring board 2 sandwich intermediate plate 3 in between, as shown in FIG. 20. Thus, through hole H is provided in first printed wiring board 1 so as to be displaced from main body 51. Consequently, electronic part 7, wiring in the substrate, and the like can be disposed on the side opposite to first printed wiring board 1 with respect to main body 51. This can also achieve suppression of deformation of composite printed wiring board 100 and improvement in design flexibility of composite printed wiring board 100 at the same time.

Embodiment 7

Next, a configuration of composite printed wiring board 100 according to Embodiment 7 will be described with reference to FIG. 21. Unless otherwise described, Embodiment 7 has the same configuration, manufacturing method, and functions and effects as those of Embodiment 5 described above. Thus, the same components as those of Embodiment 5 described above will be designated by the same reference characters, and description thereof will not be repeated.

Figure 21:
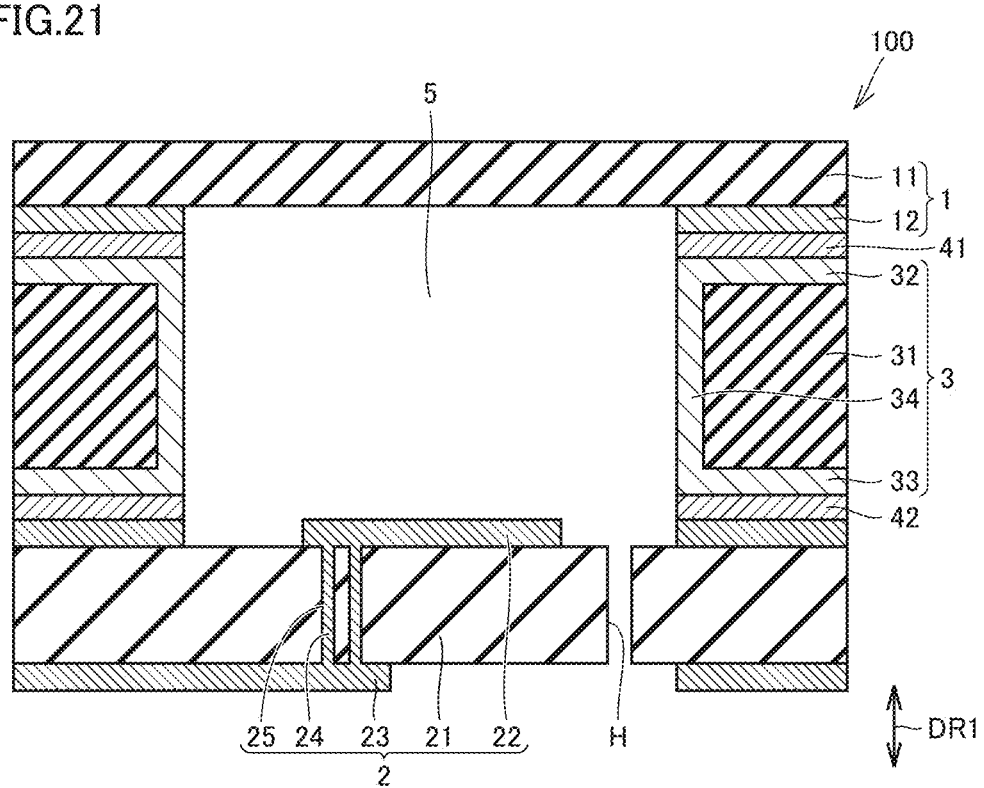
FIG. 21 is a sectional view schematically showing a configuration of a composite printed wiring board according to Embodiment 7.

As shown in FIG. 21, composite printed wiring board 100 according to the present embodiment includes first printed wiring board 1, second printed wiring board 2 having through hole H, intermediate plate 3, first bonding layer 41, and second bonding layer 42. Through hole H is provided in second printed wiring board 2. Through hole H is not provided in first printed wiring board 1. First bonding layer 41 and second bonding layer 42 are formed of a conductive adhesive sheet.

First printed wiring board 1 may be a multilayer substrate. Although not shown in the figure, a surface of first wiring layer 12 may be covered with a first plated layer. This suppresses corrosion of first wiring layer 12. The first plated layer is, for example, a nickel (Ni)-gold (Au) flash plating. In order to improve the adhesion between first wiring layer 12 and first bonding layer 41, physical roughening or chemical roughening may be performed on first wiring layer 12.

Second printed wiring board 2 may be a multilayer substrate. Although not shown in the figure, a surface of second wiring layer 22 may be covered with a second plated layer. This suppresses corrosion of second wiring layer 22. The second plated layer is, for example, a nickel (Ni)-gold (Au) flash plating. In order to improve the adhesion between second wiring layer 22 and second bonding layer 42, physical roughening or chemical roughening may be performed on second wiring layer 22.

The shape of through hole H may be determined as appropriate. Although not shown in the figure, through hole H may include a plurality of through portions. In order to suppress intrusion of a foreign matter, such as condensed water and dust, into cavity 5 through through hole H, through hole H desirably has a smaller hole diameter, and the number of through portions is desirably lower.

Next, functions and effects of the present embodiment will be described.

In composite printed wiring board 100 according to the present embodiment, through hole H is provided in second printed wiring board 2, as shown in FIG. 21. Thus, when composite printed wiring board 100 includes base plate 68 (see FIG. 2), the periphery of through hole H can be covered with base plate 68 (see FIG. 2). This can suppress intrusion of a foreign matter, such as dust and condensed water, into cavity 5 through through hole H, even when composite printed wiring board 100 is disposed outdoors. This can also suppress intrusion of a foreign matter into cavity 5 without sealing through hole H.

Embodiment 8

Next, a configuration of composite printed wiring board 100 according to Embodiment 8 will be described with reference to FIG. 22. Unless otherwise described, Embodiment 8 has the same configuration, manufacturing method, and functions and effects as those of Embodiment 5 described above. Thus, the same components as those of Embodiment 5 described above will be designated by the same reference characters, and description thereof will not be repeated.

Figure 22:
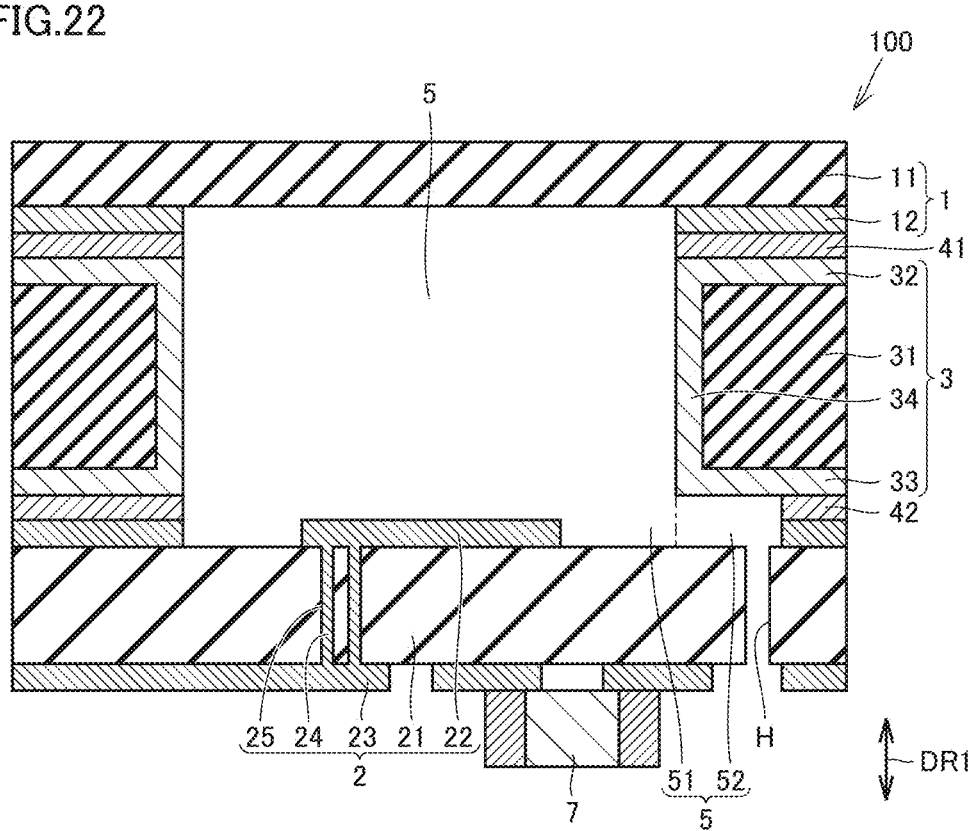
FIG. 22 is a sectional view schematically showing a configuration of a composite printed wiring board according to Embodiment 8.

As shown in FIG. 22, composite printed wiring board 100 according to the present embodiment includes first printed wiring board 1, second printed wiring board 2 having through hole H, intermediate plate 3, first bonding layer 41, and second bonding layer 42. First bonding layer 41 and second bonding layer 42 are formed of a conductive adhesive sheet.

Cavity 5 includes main body 51 and ventilation portion 52. Ventilation portion 52 is sandwiched between second printed wiring board 2 and intermediate plate 3. Ventilation portion 52 is provided by partially removing second wiring layer 22 by etching or the like. Ventilation portion 52 may be provided by partially removing second bonding layer 42 by etching or the like.

First printed wiring board 1 may be a multilayer substrate. Although not shown in the figure, a surface of first wiring layer 12 may be covered with a first plated layer. This suppresses corrosion of first wiring layer 12. The first plated layer is, for example, a nickel (Ni)-gold (Au) flash plating. In order to improve the adhesion between first wiring layer 12 and first bonding layer 41, physical roughening or chemical roughening may be performed on first wiring layer 12.

Second printed wiring board 2 may be a multilayer substrate. Although not shown in the figure, a surface of second wiring layer 22 may be covered with a second plated layer. This suppresses corrosion of second wiring layer 22. The second plated layer is, for example, a nickel (Ni)-gold (Au) flash plating. In order to improve the adhesion between second wiring layer 22 and second bonding layer 42, physical roughening or chemical roughening may be performed on second wiring layer 22.

The shapes of through hole H and ventilation portion 52 may be determined as appropriate. Although not shown in the figure, through hole H may include a plurality of through portions. Ventilation portion 52 may include a plurality of ventilation portions. In order to suppress intrusion of a foreign matter, such as condensed water and dust, into cavity 5 through through hole H and ventilation portion 52, through hole H desirably has a smaller hole diameter, and the number of through portions and the number of ventilation portions are desirably lower.

Next, functions and effects of the present embodiment will be described.

In composite printed wiring board 100 according to the present embodiment, through hole H is provided so as to overlap intermediate plate 3 in the direction (first direction DR1) in which first printed wiring board 1 and second printed wiring board 2 sandwich intermediate plate 3 in between, as shown in FIG. 22. Thus, through hole H is provided in second printed wiring board 2 so as to be displaced from main body 51. Consequently, electronic part 7, wiring in the substrate, and the like can be disposed on the side opposite to second printed wiring board 2 with respect to main body 51. This improves the design flexibility of composite printed wiring board 100. This can also achieve suppression of deformation of composite printed wiring board 100 and improvement in design flexibility of composite printed wiring board 100 at the same time.

Embodiment 9

Next, a configuration of composite printed wiring board 100 according to Embodiment 9 will be described with reference to FIG. 23. Unless otherwise described, Embodiment 9 has the same configuration, manufacturing method, and functions and effects as those of Embodiment 1 described above. Thus, the same components as those of Embodiment 1 described above will be designated by the same reference characters, and description thereof will not be repeated.

Figure 23:
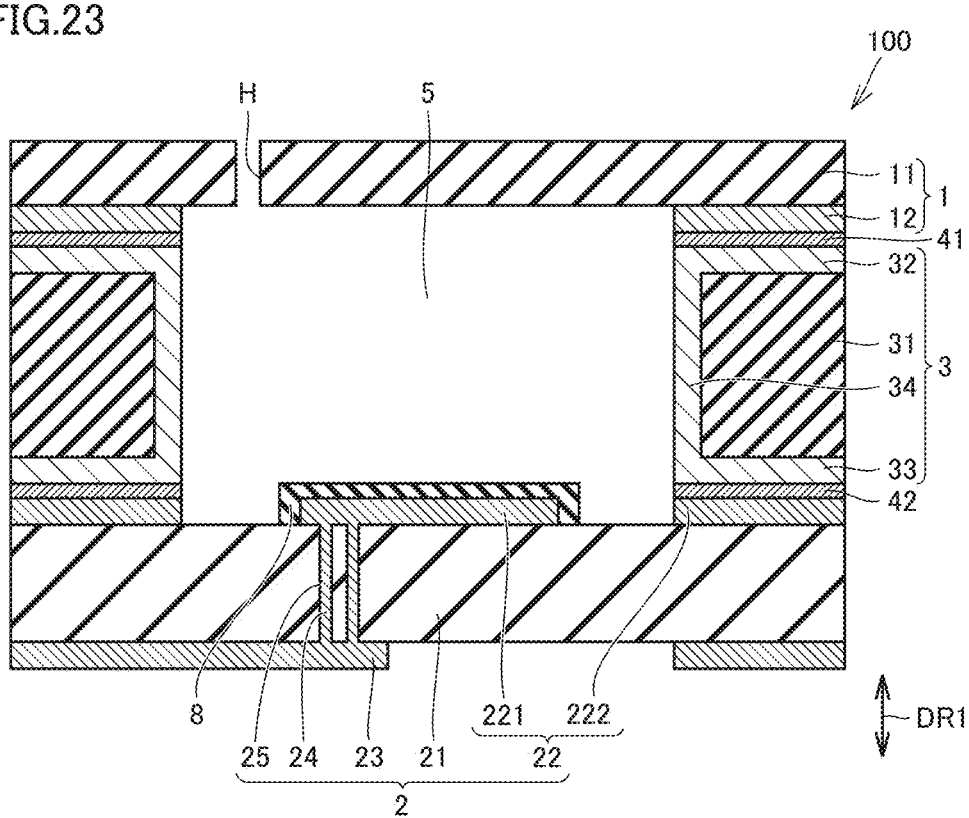
FIG. 23 is a sectional view schematically showing a configuration of a composite printed wiring board according to Embodiment 9.

As shown in FIG. 23, composite printed wiring board 100 according to the present embodiment further includes a protective portion 8. Protective portion 8 is disposed inside cavity 5. Protective portion 8 at least partially covers second printed wiring board 2. Protective portion 8 is formed of, for example, an insulating coating. Protective portion 8 is formed of, for example, a solder resist. Protective portion 8 may be formed by, for example, symbol printing used in manufacture of a substrate.

Second wiring layer 22 includes a signal electrode 221 and a bonded portion 222. Signal electrode 221 is surrounded by bonded portion 222 while being spaced from bonded portion 222. Signal electrode 221 may be surrounded by intermediate plate 3 and second bonding layer 42. Signal electrode 221 is covered with protective portion 8. As long as protective portion 8 is configured to cover signal electrode 221, the shape of protective portion 8 may be determined as appropriate. Signal electrode 221 is not exposed to cavity 5. Bonded portion 222 is bonded to intermediate plate 3 by second bonding layer 42.

Next, functions and effects of the present embodiment will be described.

In composite printed wiring board 100 according to the present embodiment, signal electrode 221 is covered with protective portion 8, as shown in FIG. 23. This can suppress contact of a foreign matter, such as dust and condensed water, with signal electrode 221 even in case of intrusion of the foreign matter into cavity 5 through through hole H. Thus, a short circuit of signal electrode 221 to a portion having a potential different from that of signal electrode 221 can be suppressed. Also, a short circuit of signal electrode 221 can be suppressed without sealing through hole H.

Embodiment 10

Next, a configuration of composite printed wiring board 100 according to Embodiment 10 will be described with reference to FIG. 24. Unless otherwise described, Embodiment 10 has the same configuration, manufacturing method, and functions and effects as those of Embodiment 5 described above. Thus, the same components as those of Embodiment 5 described above will be designated by the same reference characters, and description thereof will not be repeated.

Figure 24:
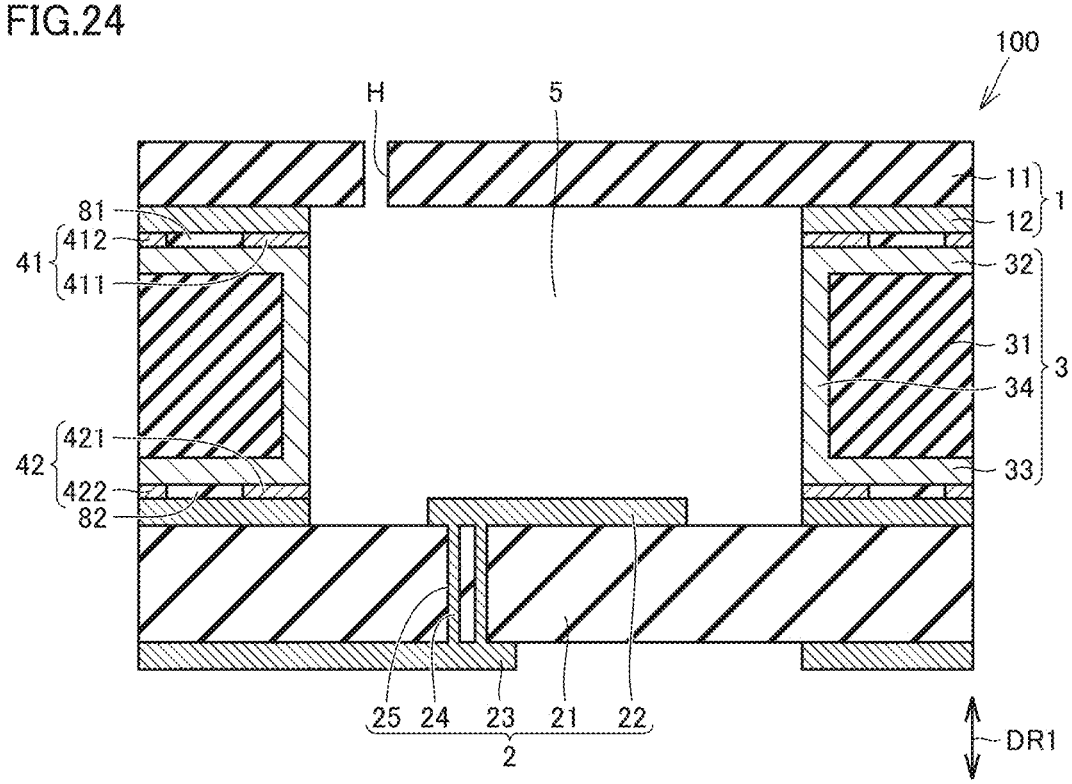
FIG. 24 is a sectional view schematically showing a configuration of a composite printed wiring board according to Embodiment 10.

As shown in FIG. 24, composite printed wiring board 100 according to the present embodiment further includes a first film portion 81 and a second film portion 82. First film portion 81 is sandwiched between first printed wiring board 1 and intermediate plate 3. Second film portion 82 is sandwiched between second printed wiring board 2 and intermediate plate 3. First film portion 81 and second film portion 82 have an annular shape. First film portion 81 deforms by pressurization less easily than first bonding layer 41. Second film portion 82 deforms by pressurization less easily than second bonding layer 42.

First film portion 81 and second film portion 82 are formed of an insulating film. First film portion 81 and second film portion 82 are formed of, for example, an insulating coating solder resist. First film portion 81 and second film may be formed by, for example, symbol printing.

First film portion 81 and second film portion 82 are configured so as to be crushed less easily than first bonding layer 41 and second bonding layer 42. First film portion 81 and second film portion 82 are desirably configured so as not to deform by pressurization.

The shape of first film portion 81 may be determined as appropriate as long as first film portion 81 is disposed between first printed wiring board 1 and intermediate plate 3. The shape of second film portion 82 may be determined as appropriate as long as second film portion 82 is disposed between second printed wiring board 2 and intermediate plate 3.

In the present embodiment, first bonding layer 41 and second bonding layer 42 are formed of a conductive adhesive sheet. First bonding layer 41 includes a first inner bonding portion 411 and a first outer bonding portion 412. First film portion 81 surrounds first inner bonding portion 411. First outer bonding portion 412 is disposed outside of first inner bonding portion 411 and first film portion 81. Second bonding layer 42 includes a second inner bonding portion 421 and a second outer bonding portion 422. Second film portion 82 surrounds second inner bonding portion 421. Second outer bonding portion 422 is disposed outside of second inner bonding portion 421 and second film portion 82.

Figure 25:
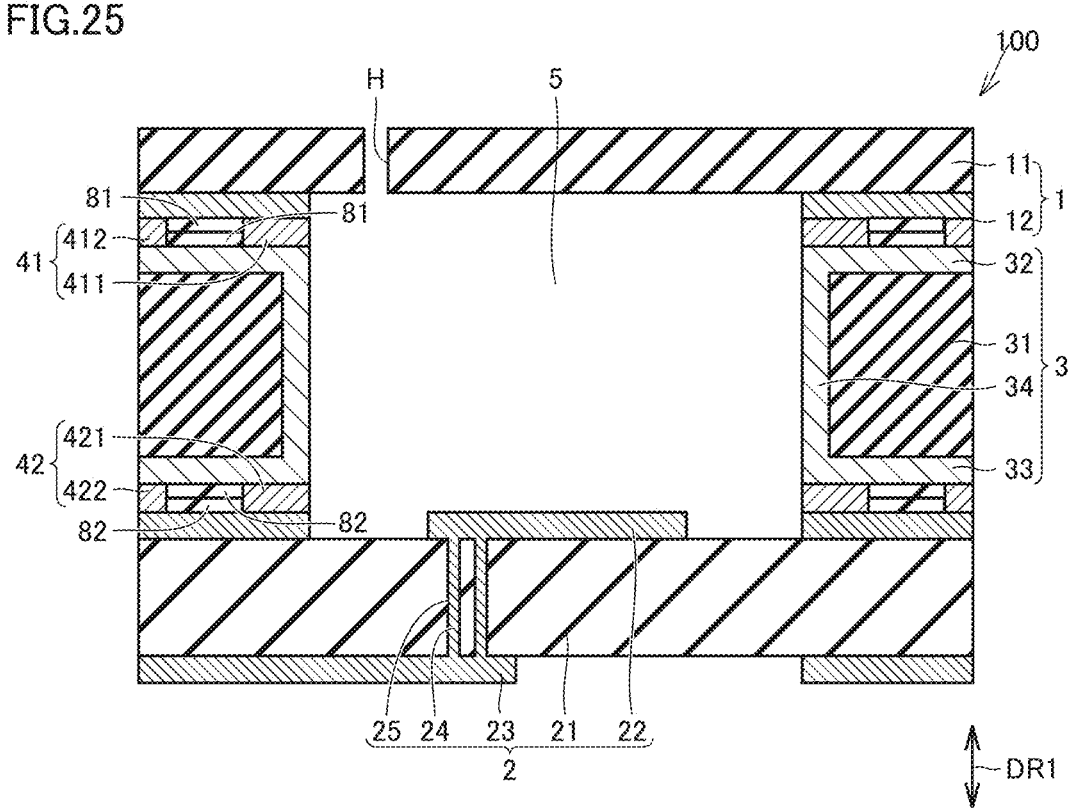
FIG. 25 is a sectional view schematically showing a configuration of a composite printed wiring board according to a variation of Embodiment 10.

As shown in FIG. 25, composite printed wiring board 100 may further include two first film portions 81 and two second film portions 82. Two first film portions 81 are stacked along first direction DR1. Two second film portions 82 are stacked along first direction DR1.

Composite printed wiring board 100 according to the present embodiment can be used in combination with composite printed wiring board 100 according to any of Embodiments 5 to 8.

Next, a method of manufacturing composite printed wiring board 100 according to Embodiment 10 will be described with reference to FIGS. 26 and 27.

Figure 26:
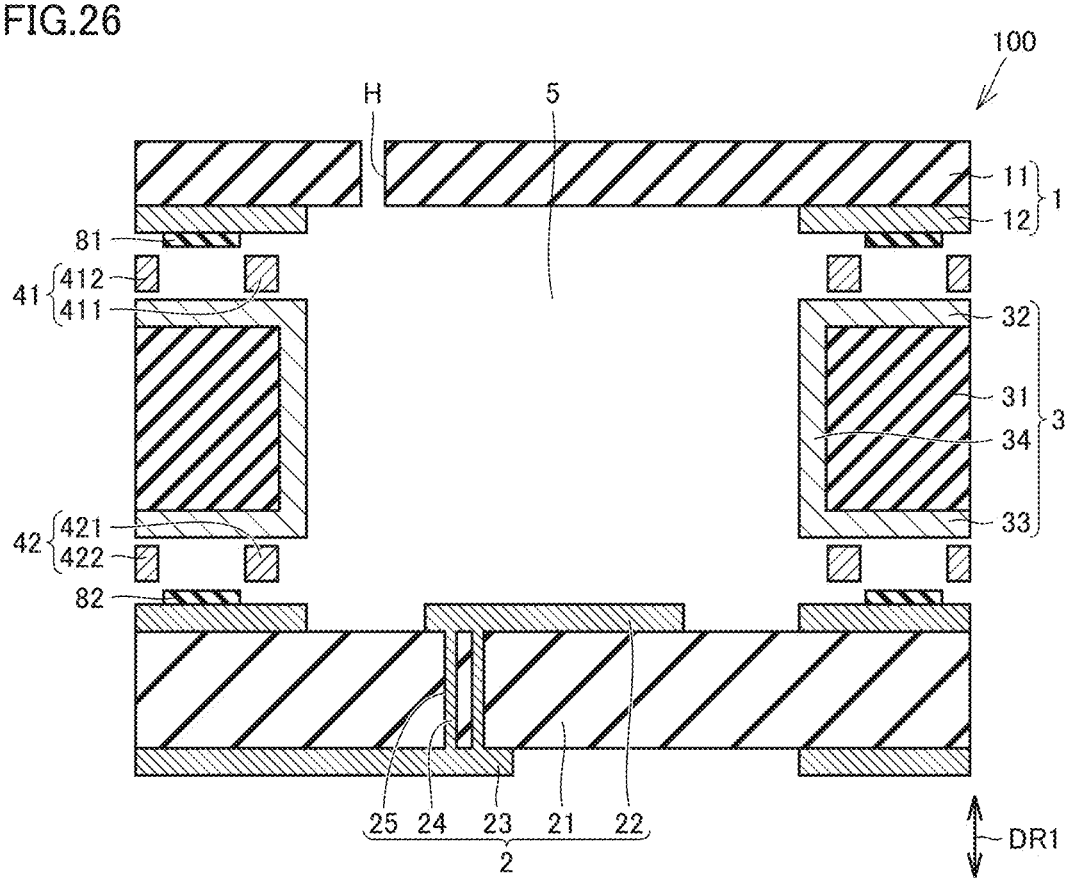
FIG. 26 is a sectional view schematically showing a state in which a first film portion and a second film portion of the composite printed wiring board according to Embodiment 10 are disposed on a first printed wiring board and a second printed wiring board, respectively.
Figure 27:
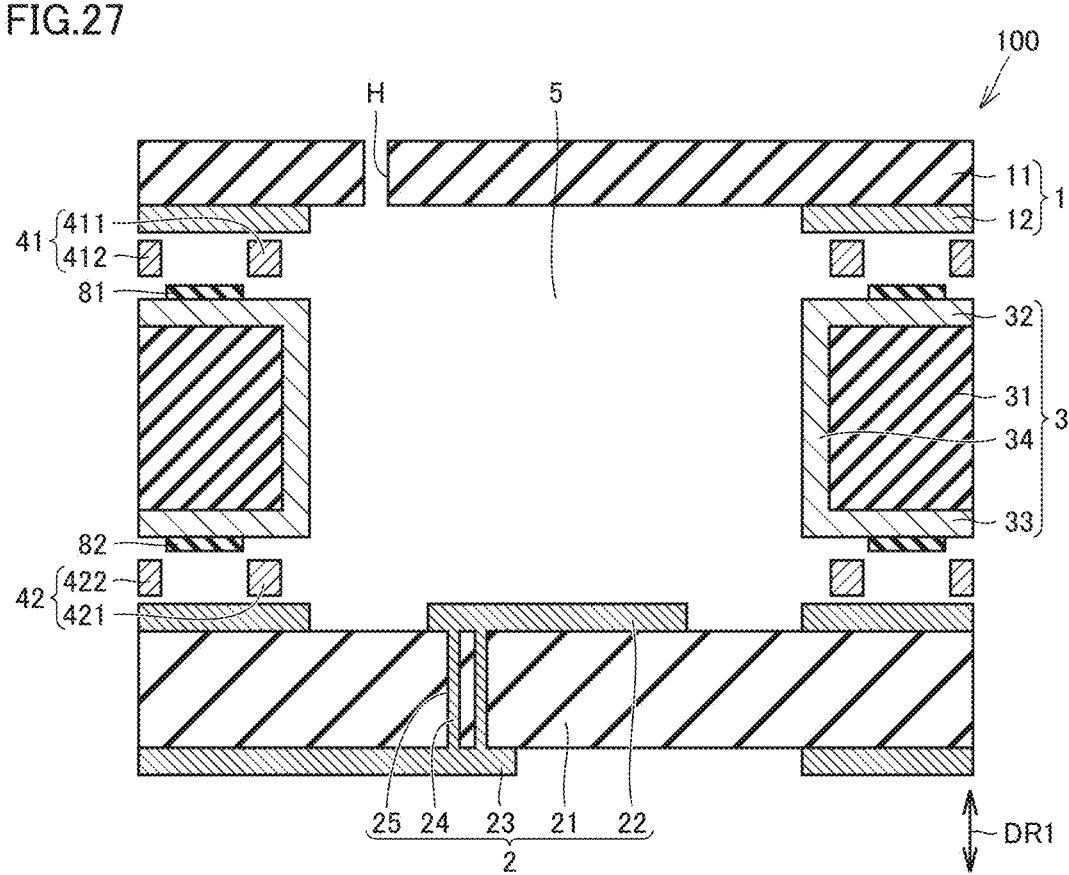
FIG. 27 is a sectional view schematically showing a state in which the first film portion and the second film portion of the composite printed wiring board according to Embodiment 10 are each disposed on an intermediate plate.

As shown in FIG. 26, in preparation step S101, first film portion 81 and second film portion 82 are further prepared. First film portion 81 and second film portion 82 may be prepared as solder resists applied to first wiring layer 12 and second wiring layer 22, respectively. As shown in FIG. 27, first film portion 81 and second film portion 82 may be prepared as solder resists applied to first intermediate wiring layer 32 and second intermediate wiring layer 33, respectively.

The thickness of the solder resist is desirably equal to the thickness of each of first bonding layer 41 and second bonding layer 42 after pressurization. Desirably, first bonding layer 41 and second bonding layer 42 are processed in advance so as not to overlap regions to which the solder resists, which turn into first film portion 81 and second film portion 82, respectively, are applied. Desirably, first bonding layer 41 and second bonding layer 42 are prepared in consideration of displacement occurring in laying-up of first printed wiring board 1, second printed wiring board 2, and intermediate plate 3. Desirably, first bonding layer 41 and second bonding layer 42 are prepared in consideration of an amount of crush due to pressurization. For example, first bonding layer 41 and second bonding layer 42 are desirably prepared so as to be disposed at ends of a wiring layer after being crushed by pressurization.

Subsequently, in bonding step S102, first film portion 81 and second film portion 82 are pressurized. The thickness of first bonding layer 41 and second bonding layer 42 is desirably, for example, two-thirds of the thickness of first bonding layer 41 and second bonding layer 42 before pressurization.

Next, a method of manufacturing composite printed wiring board 100 according to Embodiment 10 will be described with reference to FIG. 28.

Figure 28:
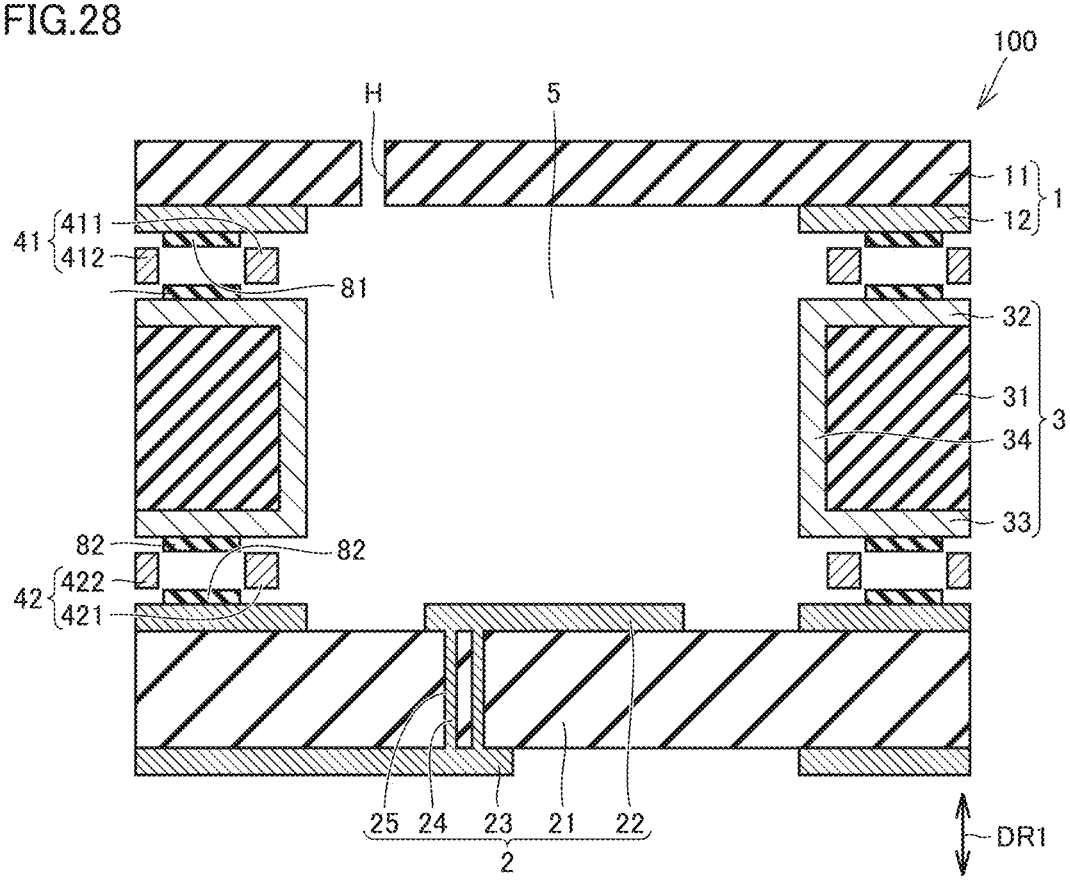
FIG. 28 is a sectional view schematically showing a state in which two first film portions of a composite printed wiring board according to a variation of Embodiment 10 are disposed respectively on a first printed wiring board and an intermediate plate, and two second film portions of the composite printed wiring board are disposed respectively on a second printed wiring board and the intermediate plate.

As shown in FIG. 28, in preparation step S101, first film portions 81 are prepared as solder resists respectively applied to first wiring layer 12 and first intermediate wiring layer 32, and second film portions 82 are applied as solder resists respectively applied to second wiring layer 22 and second intermediate wiring layer 33. Subsequently, two first film portions 81 and two second film portions 82 are pressurized.

Next, functions and effects of the present embodiment will be described.

When first film portion 81 and second film portion 82 are not disposed between first printed wiring board 1 and intermediate plate 3 and between second printed wiring board 2 and intermediate plate 3, respectively, first bonding layer 41 and second bonding layer 42 may be excessively crushed by pressurization. If first bonding layer 41 and second bonding layer 42 are excessively crushed, a bonding strength may become insufficient. As first bonding layer 41 and second bonding layer 42 extend in the in-plane direction, first bonding layer 41 and second bonding layer 42 may be crushed to project from intermediate plate 3 toward cavity 5.

Contrastingly, in composite printed wiring board 100 according to the present embodiment, first film portion 81 is sandwiched between first printed wiring board 1 and intermediate plate 3, and second film portion 82 is sandwiched between second printed wiring board 2 and intermediate plate 3, as shown in FIG. 24. This can suppress crushing of first bonding layer 41 and second bonding layer 42 more than first film portion 81 and second film portion 82. Excessive crushing of first bonding layer 41 and second bonding layer 42 by pressurization can be suppressed. The thickness of first bonding layer 41 and second bonding layer 42 after bonding is equal to the thickness of first film portion 81 and second film portion 82. Desirably, the thickness of first bonding layer 41 and second bonding layer 42 after pressurization (after bonding) is approximately two-thirds of the thickness of first bonding layer 41 and second bonding layer 42 before pressurization (before bonding). Thus, the thickness of first film portion 81 and second film portion 82 is approximately two-thirds of the thickness of first bonding layer 41 and second bonding layer 42 before pressurization.

Embodiment 11

Next, a configuration of composite printed wiring board 100 according to Embodiment 11 will be described with reference to FIG. 29. Unless otherwise described, Embodiment 11 has the same configuration, manufacturing method, and functions and effects as those of Embodiment 10 described above. Thus, the same components as those of Embodiment 10 described above will be designated by the same reference characters, and description thereof will not be repeated.

Figure 29:
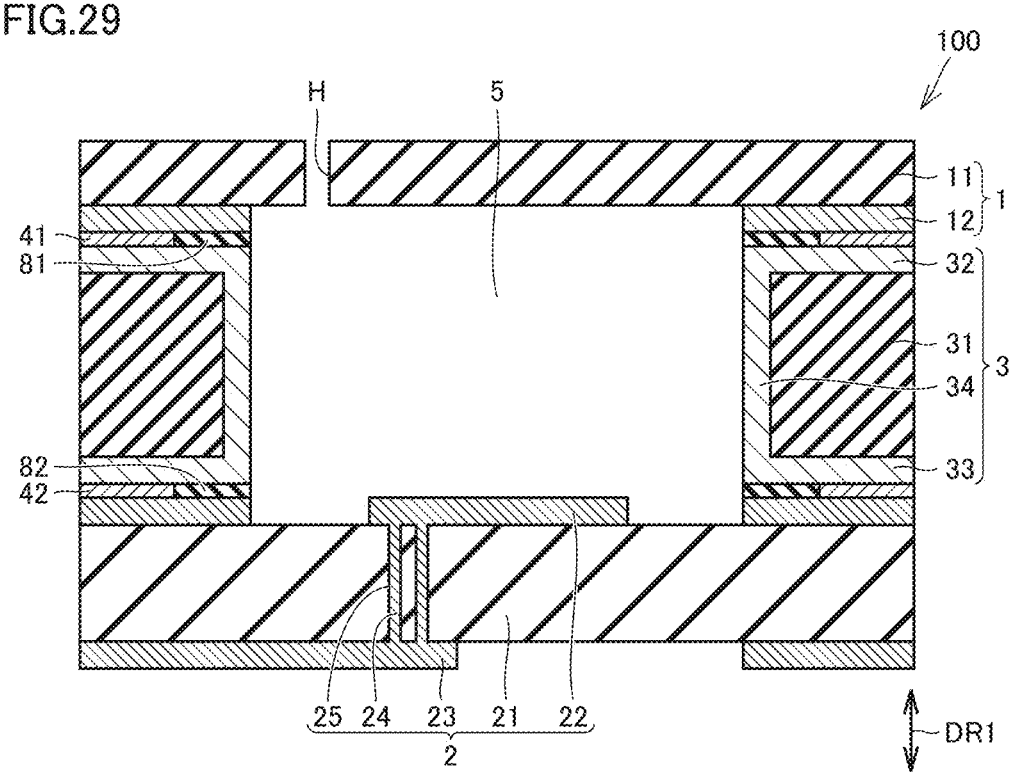
FIG. 29 is a sectional view schematically showing a configuration of a composite printed wiring board according to Embodiment 11.

As shown in FIG. 29, in composite printed wiring board 100 according to the present embodiment, first film portion 81 is disposed inside of first bonding layer 41. Second film portion 82 is disposed inside of second bonding layer 42. The position of the end of first film portion 81 is desirably the same as the position of the end of first wiring layer 12. The position of the end of second film portion 82 is desirably the same as the position of the end of second wiring layer 22.

The shapes of first film portion 81 and second film portion 82 may be determined as appropriate as long as first film portion 81 and second film portion 82 surround cavity 5. First film portion 81 and second film portion 82 are formed of, for example, an insulating coating solder resist. First film portion 81 and second film are formed by, for example, symbol printing.

Composite printed wiring board 100 according to the present embodiment can be used in combination with composite printed wiring board 100 according to any of Embodiments 5 to 8.

Figure 30:
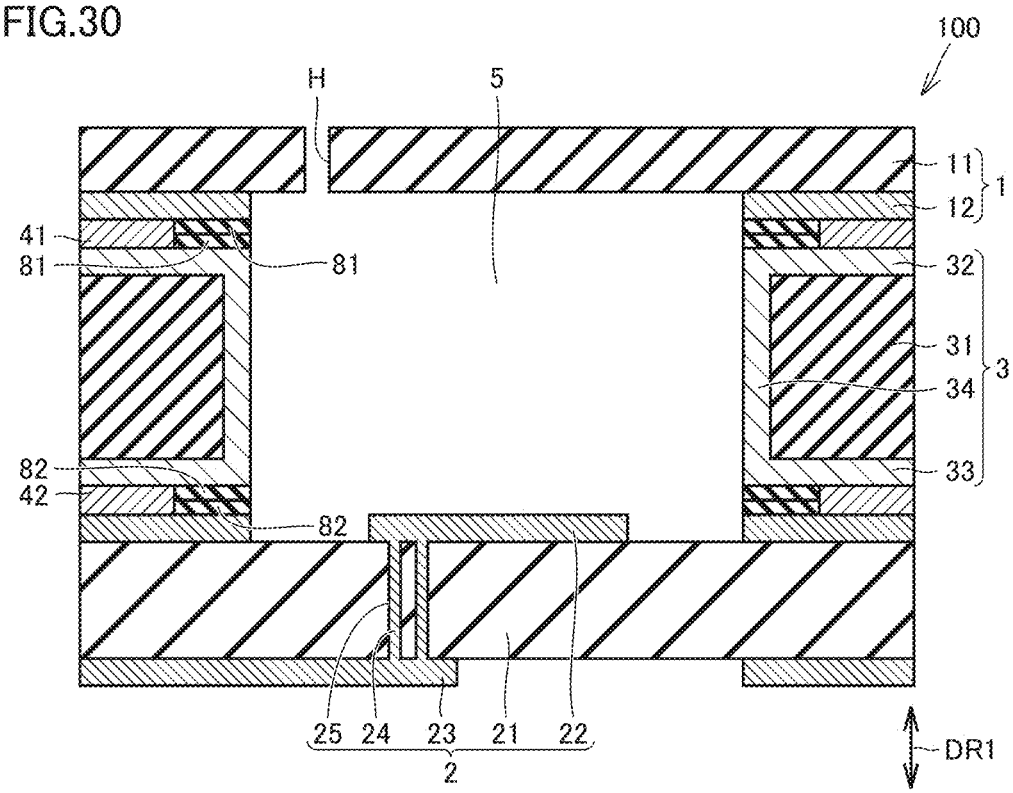
FIG. 30 is a sectional view schematically showing a configuration of a composite printed wiring board according to a variation of Embodiment 11.

As shown in FIG. 30, composite printed wiring board 100 may include two first film portions 81 and two second film portions 82.

Next, a method of manufacturing composite printed wiring board 100 according to Embodiment 11 will be described with reference to FIGS. 31 to 33.

Figure 31:
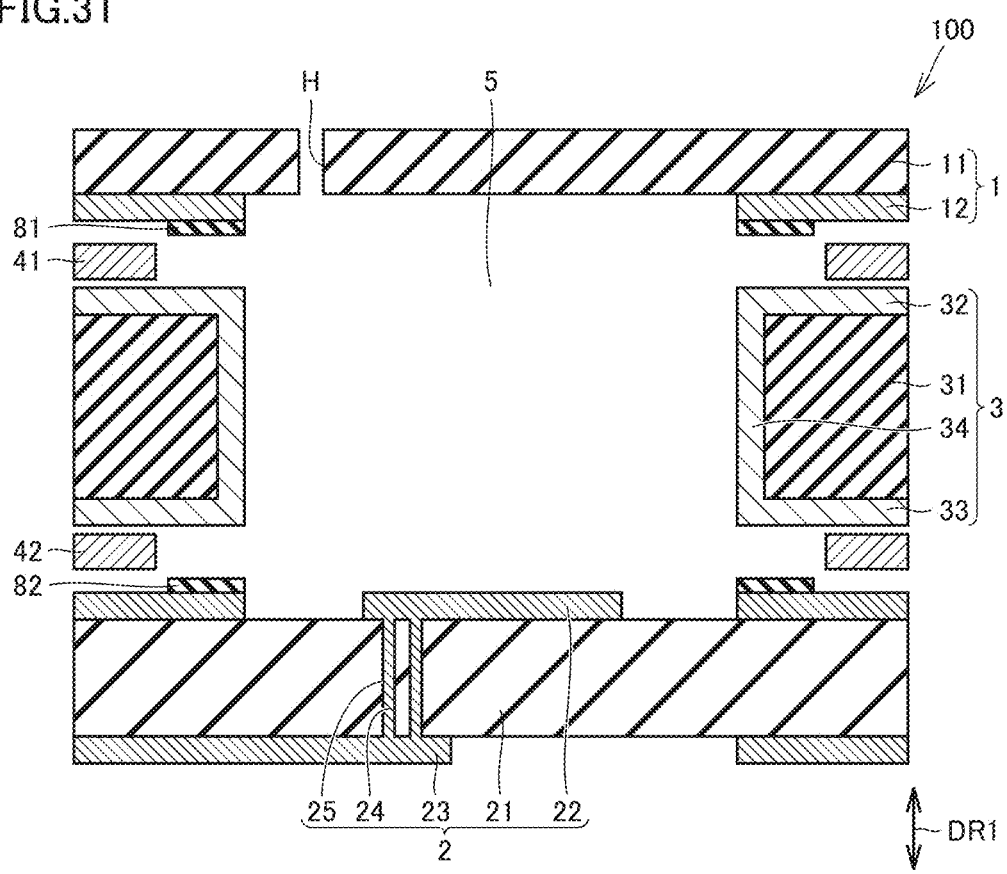
FIG. 31 is a sectional view schematically showing a state in which a first film portion and a second film portion of the composite printed wiring board according to Embodiment 11 are disposed on a first printed wiring board and a second printed wiring board, respectively.

As shown in FIG. 31, in preparation step S101, first film portion 81 and second film portion 82 are further prepared. First bonding layer 41 and second bonding layer 42 are desirably processed in advance so as not to overlap regions to which the solder resists, which turn into first film portion 81 and second film portion 82, respectively, are applied. First bonding layer 41 and second bonding layer 42 are desirably prepared in consideration of misalignment in laying-up of first printed wiring board 1, second printed wiring board 2, and intermediate plate 3. First bonding layer 41 and second bonding layer 42 are desirably prepared in consideration of an amount of crush by pressurization. For example, first bonding layer 41 and second bonding layer 42 are desirably prepared so as to be positioned at the ends of a wiring layer after being crushed by pressurization.

Figure 32:
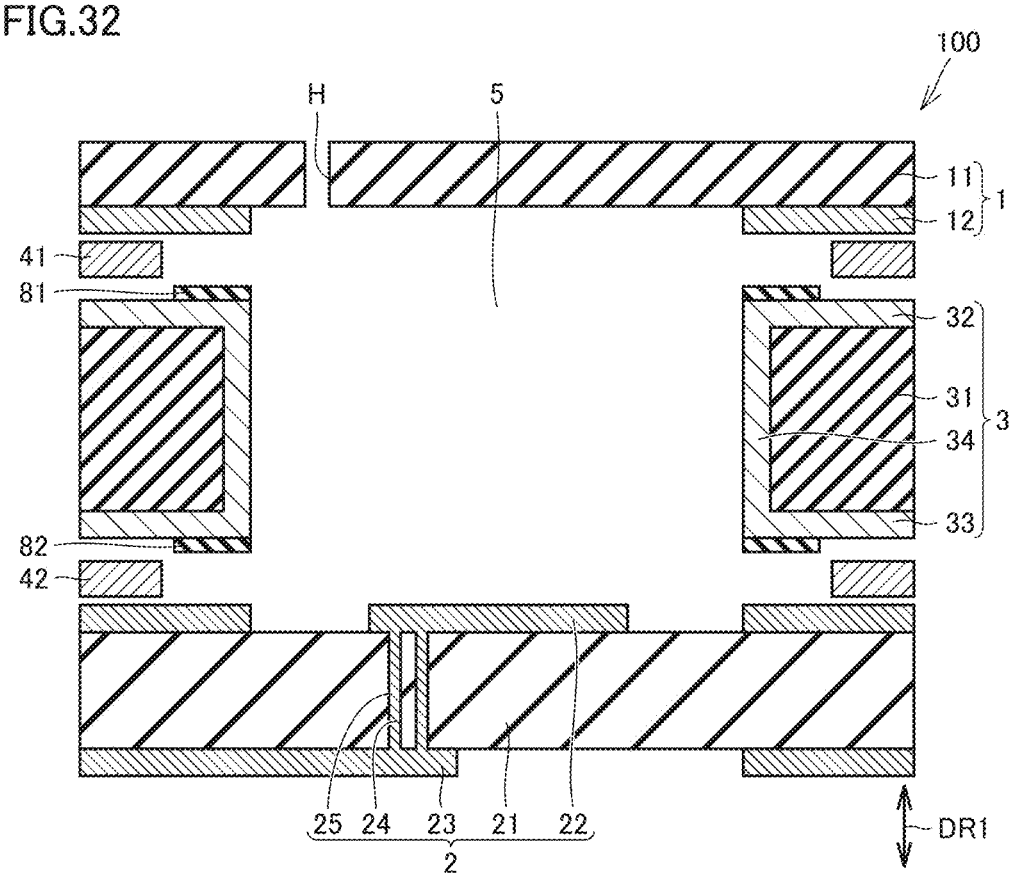
FIG. 32 is a sectional view schematically showing a state in which the first film portion and the second film portion of the composite printed wiring board according to Embodiment 11 are each disposed on an intermediate plate.

As shown in FIG. 32, first film portion 81 and second film portion 82 may be prepared as being applied to intermediate plate 3.

Figure 33:
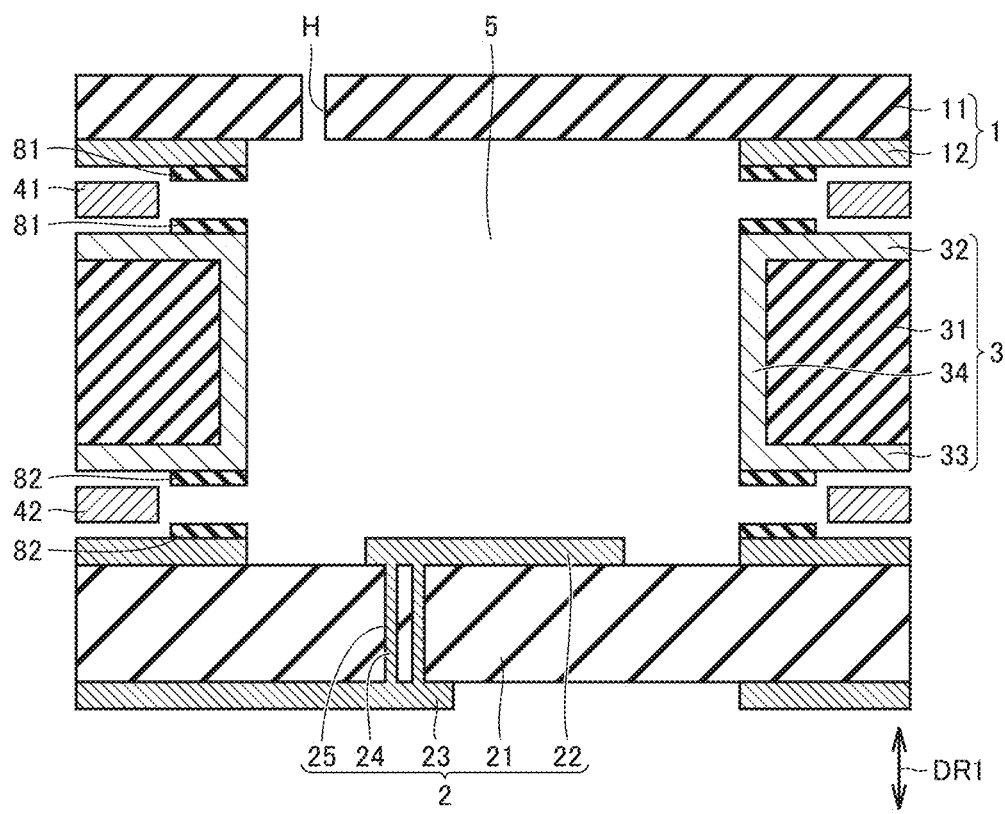
FIG. 33 is a sectional view schematically showing a state in which two first film portions of a composite printed wiring board according to a variation of Embodiment 11 are disposed respectively on a first printed wiring board and an intermediate plate, and two second film portions of the composite printed wiring board are disposed respectively on a second printed wiring board and the intermediate plate.

As shown in FIG. 33, two first film portions 81 may be prepared as a primary first film portion 81 applied to intermediate plate 3 and a secondary first film portion 81 applied to first printed wiring board 1. Two second film portions 82 may be prepared as a primary second film portion 82 applied to intermediate plate 3 and a secondary second film portion 82 applied to second printed wiring board 2.

Next, functions and effects of the present embodiment will be described.

In composite printed wiring board 100 according to the present embodiment, first film portion 81 is disposed inside of first bonding layer 41, and second film portion 82 is disposed inside of second bonding layer 42, as shown in FIG. 29. This can suppress crushing of first bonding layer 41 and second bonding layer 42 so as to project toward the inside of cavity 5 even when first bonding layer 41 and second bonding layer 42 are crushed. First film portion 81 and second film portion 82 can serve as a dam that suppresses projection of first bonding layer 41 and second bonding layer 42.

Embodiment 12

Next, a configuration of composite printed wiring board 100 according to Embodiment 12 will be described with reference to FIG. 34. Unless otherwise described, Embodiment 12 has the same configuration, manufacturing method, and functions and effects as those of Embodiment 1 described above. Thus, the same components as those of Embodiment 1 described above will be designated by the same reference characters, and description thereof will not be repeated.

Figure 34:
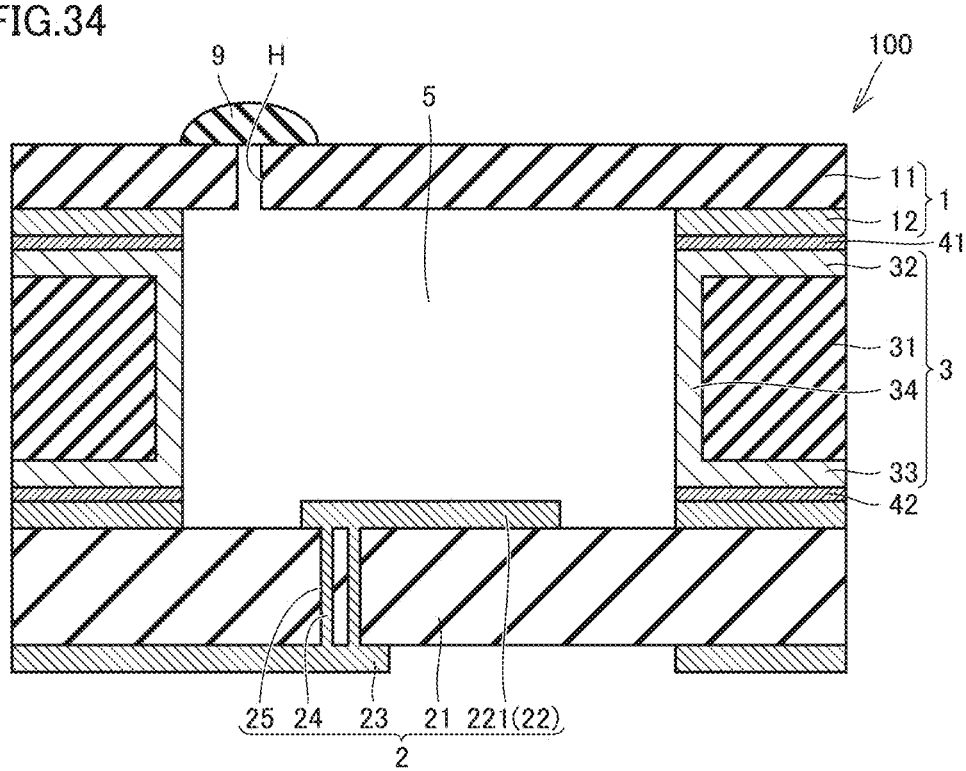
FIG. 34 is a sectional view schematically showing a configuration of a composite printed wiring board according to Embodiment 12.

As shown in FIG. 34, composite printed wiring board 100 according to the present embodiment further includes a sealing portion 9. Sealing portion 9 seals through hole H. Sealing portion 9 seals through hole H outside of cavity 5. Sealing portion 9 is formed of, for example, an adhesive resin. If the adhesive resin hardens by pressurization, a thermal distortion may occur in first printed wiring board 1 or second printed wiring board 2 due to thermal expansion of the air inside cavity 5. For this reason, the adhesive resin is desirably formed to harden at normal temperature. Also, the adhesive resin is desirably formed to harden without heating.

The pressure inside cavity 5 is equal to atmospheric pressure. The pressure inside cavity 5 is equal to the pressure outside cavity 5.

Composite printed wiring board 100 according to the present embodiment can be used in combination with composite printed wiring board 100 according to any of Embodiments 1 to 9.

Next, a method of manufacturing composite printed wiring board 100 according to the present embodiment will be described.

In the present embodiment, a step S103 of sealing through hole H is provided after bonding step S102. In step S103 of sealing through hole H, sealing portion 9 is disposed on first printed wiring board 1 so as to close through hole H. Specifically, first, the adhesive resin that turns into sealing portion 9 is applied to first printed wiring board 1 so as to close through hole H. Subsequently, as the adhesive resin hardens, sealing portion 9 is formed. Step S103 of sealing through hole H is preferably performed after the part mounting step, which is a step of mounting a part in composite printed wiring board 100. Also in mounting of a part, a pressure difference occurring between the pressures inside and outside cavity 5 can be suppressed. Consequently, the deformations of first printed wiring board 1 and second printed wiring board 2 due to a pressure difference can be suppressed also in mounting of a part.

Next, functions and effects of the present embodiment will be described. In composite printed wiring board 100 according to the present embodiment, sealing portion 9 seals through hole H as shown in FIG. 34. This can suppress intrusion of a foreign matter, such as dust and condensed water, into cavity 5 through through hole H. Consequently, a short circuit of signal electrode 221 due to a foreign matter can be suppressed.

Embodiment 13

Next, a configuration of composite printed wiring board 100 according to Embodiment 13 will be described with reference to FIG. 35. Unless otherwise described, Embodiment 13 has the same configuration, manufacturing method, and functions and effects as those of Embodiment 12 described above. Thus, the same components as those of Embodiment 12 described above will be designated by the same reference characters, and description thereof will not be repeated.

Figure 35:
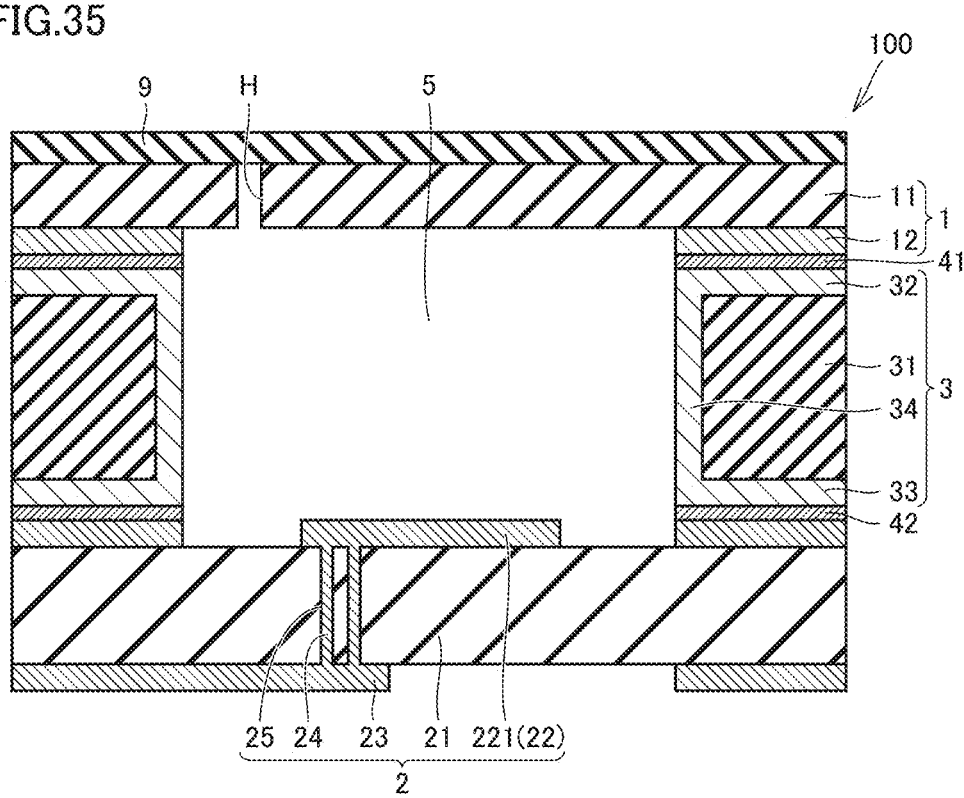
FIG. 35 is a sectional view schematically showing a configuration of a composite printed wiring board according to Embodiment 13.

As shown in FIG. 35, in composite printed wiring board 100 according to the present embodiment, sealing portion 9 seals through hole H. Sealing portion 9 is formed of an adhesive sheet or a coating agent. Sealing portion 9 covers the entire surface of first printed wiring board 1. When sealing portion 9 is formed of the adhesive sheet, sealing portion 9 is attached to the entire surface of first printed wiring board 1.

Composite printed wiring board 100 according to the present embodiment can be used in combination with composite printed wiring board 100 according to any of Embodiments 1 to 9.

Next, functions and effects of the present embodiment will be described.

In composite printed wiring board 100 according to the present embodiment, sealing portion 9 seals through hole H as shown in FIG. 35. This can suppress intrusion of a foreign matter, such as dust and condensed water, into cavity 5 through through hole H. Consequently, a short circuit of signal electrode 221 due to a foreign matter can be suppressed.

Embodiment 14

Next, a configuration of composite printed wiring board 100 according to Embodiment 14 will be described with reference to FIG. 36. Unless otherwise described, Embodiment 14 has the same configuration, manufacturing method, and functions and effects as those of Embodiment 13 described above. Thus, the same components as those of Embodiment 13 described above will be designated by the same reference characters, and description thereof will not be repeated.

Figure 36:
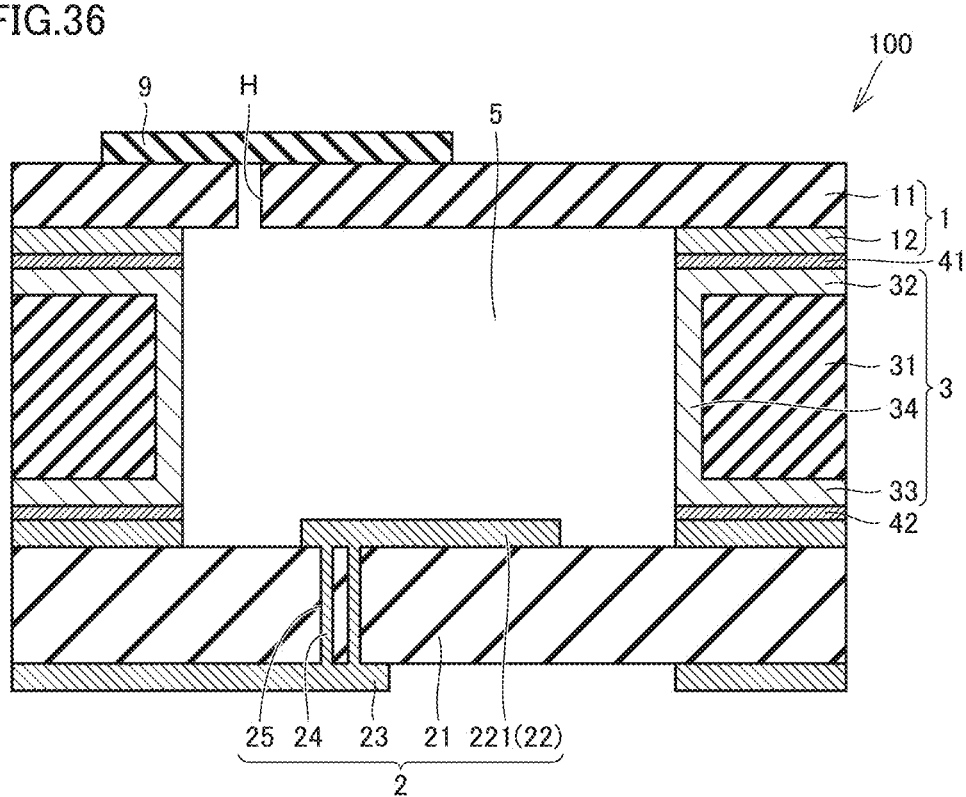
FIG. 36 is a sectional view schematically showing a configuration of a composite printed wiring board according to Embodiment 14.

As shown in FIG. 36, in composite printed wiring board 100 according to the present embodiment, sealing portion 9 seals through hole H. Sealing portion 9 partially covers first printed wiring board 1. Sealing portion 9 desirably has minimum necessary dimensions.

Composite printed wiring board 100 according to the present embodiment can be used in combination with composite printed wiring board 100 according to any of Embodiments 1 to 9.

Next, functions and effects of the present embodiment will be described.

In composite printed wiring board 100 according to the present embodiment, sealing portion 9 seals through hole H as shown in FIG. 36. This can suppress intrusion of a foreign matter, such as dust and condensed water, into cavity 5 through through hole H. Consequently, a short circuit of signal electrode 221 due to a foreign matter can be suppressed. Also, sealing portion 9 partially covers first printed wiring board 1. This results in a smaller amount of sealing resin used as sealing portion 9 than when sealing portion 9 entirely covers first printed wiring board 1. This can reduce a manufacturing cost of composite printed wiring board 100. Consequently, suppression of a short circuit of signal electrode 221 and a reduction in manufacturing cost can be achieved at the same time.

Embodiment 15

A configuration of composite printed wiring board 100 according to Embodiment 15 will be described with reference to FIGS. 37 and 38. Unless otherwise described, Embodiment 15 has the same configuration, manufacturing method, and functions and effects as those of Embodiment 14 described above. Thus, the same components as those of Embodiment 14 described above will be designated by the same reference characters, and description thereof will not be repeated.

Figure 37:
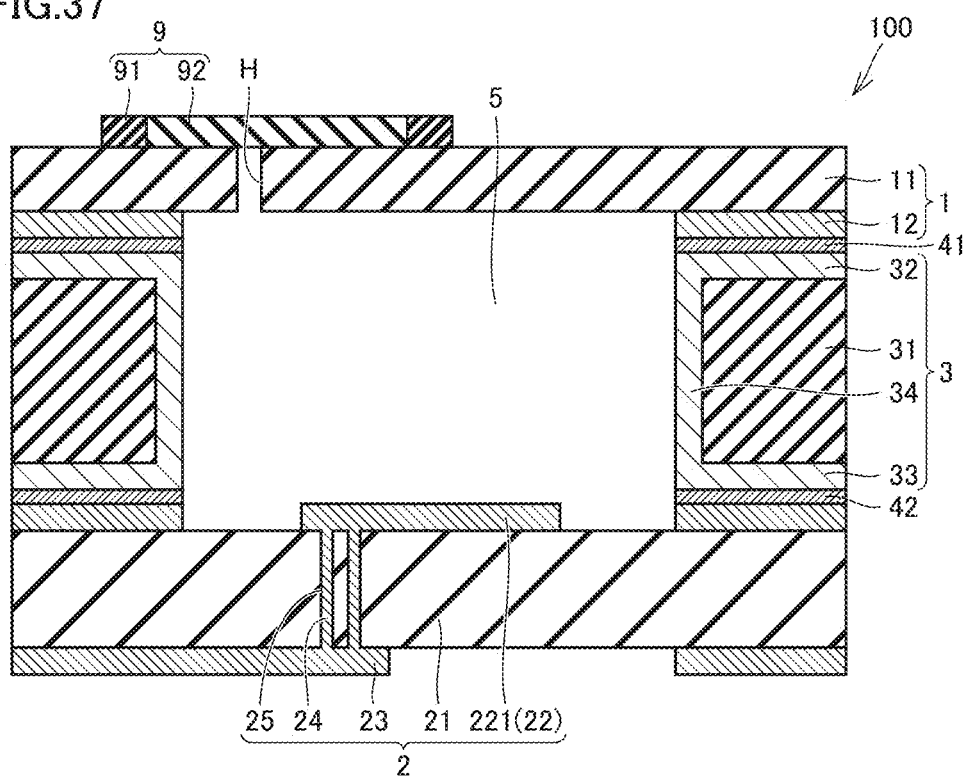
FIG. 37 is a sectional view schematically showing a configuration of a composite printed wiring board according to Embodiment 15.

As shown in FIG. 37, in composite printed wiring board 100 according to the present embodiment, sealing portion 9 seals through hole H. Sealing portion 9 includes a fixing portion 91 and an expansion and contraction portion 92. Fixing portion 91 has an annular shape. Fixing portion 91 is disposed to surround through hole H. Fixing portion 91 fixes expansion and contraction portion 92 to first printed wiring board 1.

Expansion and contraction portion 92 is disposed to cover through hole H. Expansion and contraction portion 92 is formed of a sheet. The sheet is formed of an elastic material. As shown in FIG. 38, expansion and contraction portion 92 is configured in such a deformable manner as to expand to the side opposite to cavity 5 with respect to composite printed wiring board 100. Expansion and contraction portion 92 expands to the side opposite to cavity 5 with respect to composite printed wiring board 100 when the pressure inside cavity 5 rises. Expansion and contraction portion 92 is not fixed to first printed wiring board 1 except for at a portion fixed to first printed wiring board 1 by fixing portion 91.

Next, functions and effects of the present embodiment will be described.

Figure 38:
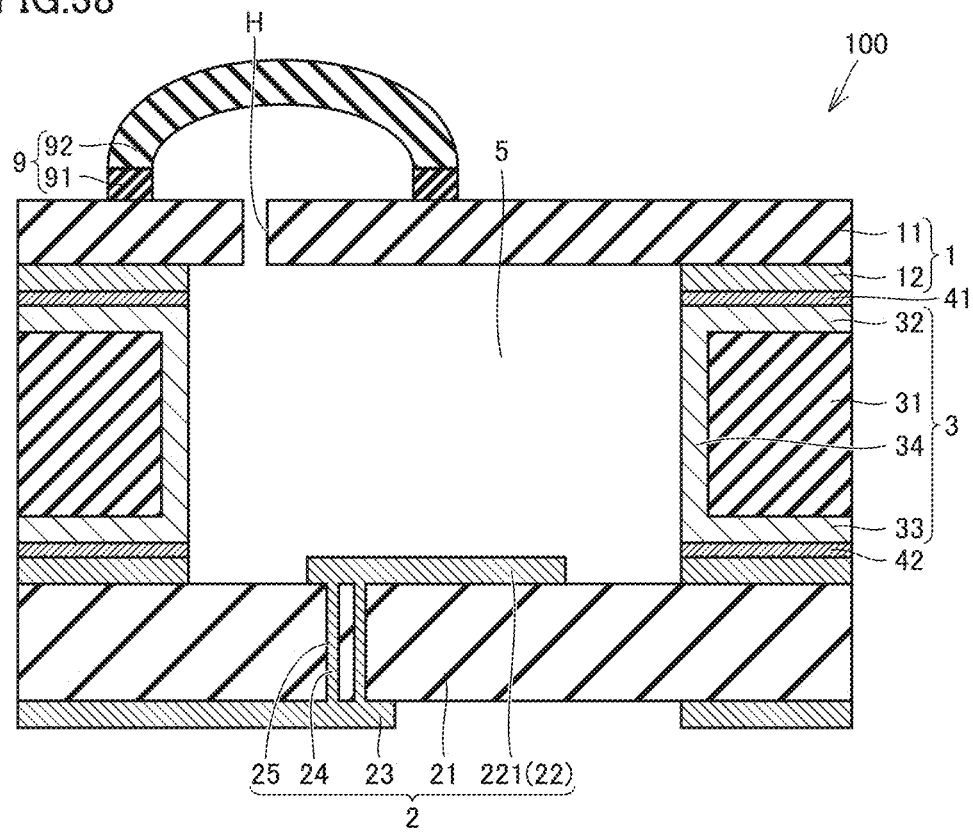
FIG. 38 is a sectional view showing a state in which an expansion and contraction portion of the composite printed wiring board according to Embodiment 15 is expanded.

In composite printed wiring board 100 according to the present embodiment, expansion and contraction portion 92 is configured in such a deformable manner as to expand to the side opposite to cavity 5 with respect to composite printed wiring board 100, as shown in FIG. 38. Thus, even when a temperature difference occurs between inside of cavity 5 and outside of cavity 5, a rise in pressure inside cavity 5 can be suppressed as expansion and contraction portion 92 expands to the side opposite to cavity 5. This can suppress deformations of first printed wiring board 1 and second printed wiring board 2. Consequently, the deformations of first printed wiring board 1 and second printed wiring board 2 can be suppressed even when the environment around composite printed wiring board 100 changes. Also, since sealing portion 9 seals through hole H, intrusion of a foreign matter into cavity 5 through through hole H can be suppressed. Consequently, suppression of deformations of first printed wiring board 1 and second printed wiring board 2 and suppression of intrusion of a foreign matter into cavity 5 can be achieved at the same time.

It should be understood that the embodiments disclosed herein have been presented for the purpose of illustration and non-restrictive in every respect. It is therefore intended that the scope of the present disclosure is defined by claims, not only by the embodiments described above, and encompasses all modifications and variations equivalent in meaning and scope to the claims.

REFERENCE SIGNS LIST 1 first printed wiring board; 2 second printed wiring board; 3 intermediate plate; 5 cavity; 9 sealing portion;

41 first bonding layer; 42 second bonding layer; 51 main body; 52 ventilation portion; 100 composite printed wiring board; H through hole.

The invention claimed is:

1. A composite printed wiring board comprising:
an intermediate plate provided to surround a space;
a first printed wiring board closing one side of the space and bonded to the intermediate plate;
a second printed wiring board closing the other side of the space and bonded to the intermediate plate;
a first bonding layer bonding the first printed wiring board to the intermediate plate; and
a second bonding layer bonding the second printed wiring board to the intermediate plate; and
a through hole provided in at least any of the first printed wiring board and the second printed wiring board and communicating with a cavity, the cavity being the space surrounded by the first printed wiring board, the second printed wiring board, the intermediate plate, the first bonding layer, and the second bonding layer, wherein
the cavity includes
a main body sandwiched between the first printed wiring board and the second printed wiring board, and
a ventilation portion connected to the main body and sandwiched between the intermediate plate and any of the first printed wiring board and the second printed wiring board, and
the through hole communicates with the main body via the ventilation portion and is provided to overlap the intermediate plate in a direction in which the first printed wiring board and the second printed wiring board sandwich the intermediate plate in between.

2. The composite printed wiring board according to claim 1, wherein the through hole is provided in the first printed wiring board.

3. The composite printed wiring board according to claim 1, wherein the through hole is provided in the second printed wiring board.

4. The composite printed wiring board according to claim 1, wherein each of the first bonding layer and the second bonding layer is formed of a metallic compound.

5. The composite printed wiring board according to claim 1, wherein each of the first bonding layer and the second bonding layer is formed of a resin and an electrically conductive filler.

6. The composite printed wiring board according to claim 1, further comprising a sealing portion, wherein
a pressure inside the cavity is equal to an atmospheric pressure, and
the sealing portion seals the through hole.

7. The composite printed wiring board according to claim 6, wherein the sealing portion includes
an expansion and contraction portion disposed to cover the through hole, and
a fixing portion disposed to surround the through hole and fixing the expansion and contraction portion to the first printed wiring board or the second printed wiring board.

8. The composite printed wiring board according to claim 1, further comprising:
a signal electrode provided on any of the first printed wiring board and the second printed wiring board in the cavity; and
a protective portion covering the signal electrode.

9. The composite printed wiring board according to claim 1, further comprising:
a first film portion sandwiched between the first printed wiring board and the intermediate plate; and
a second film portion sandwiched between the second printed wiring board and the intermediate plate, wherein
the first film portion deforms by pressurization less easily than the first bonding layer, and
the second film portion deforms by pressurization less easily than the second bonding layer.

10. A method of manufacturing a composite printed wiring board, the method comprising:
preparing a first printed wiring board, a second printed wiring board, an intermediate plate, a first bonding layer, and a second bonding layer such that the first bonding layer is disposed between the first printed wiring board and the intermediate plate, the second bonding layer is disposed between the second printed wiring board and the intermediate plate, a cavity that is a space surrounded by the first printed wiring board, the second printed wiring board, the intermediate plate, the first bonding layer, and the second bonding layer includes a main body sandwiched between the first printed wiring board and the second printed wiring board, and a ventilation portion connected to the main body and sandwiched between the intermediate plate and any of the first printed wiring board and the second printed wiring board, and a through hole is provided in at least any of the first printed wiring board and the second printed wiring board so that the through hole communicates with the main body via the ventilation portion and overlaps the intermediate plate in a direction in which the first printed wiring board and the second printed wiring board sandwich the intermediate plate in between; and
bonding the intermediate plate to the first printed wiring board and the second printed wiring board by the first bonding layer and the second bonding layer, respectively, with the cavity communicating with the through hole.

11. The method of manufacturing a composite printed wiring board according to claim 10, wherein
in the preparing, each of the first bonding layer and the second bonding layer is a layer made of a first metal and a layer made of a second metal having a lower melting point than a melting point of the first metal, and
in the bonding, heating is performed to a temperature higher than or equal to the melting point of the second metal to mutually diffuse the first metal and the second metal to form the first bonding layer and the second bonding layer.

12. The method of manufacturing a composite printed wiring board according to claim 10, wherein each of the first bonding layer and the second bonding layer is formed of a resin and an electrically conductive filler.

13. The method of manufacturing a composite printed wiring board according to claim 10, the method further comprising sealing the through hole after the bonding.

* * * * *